(12) United States Patent
Buis et al.

(10) Patent No.: US 8,817,232 B2
(45) Date of Patent: Aug. 26, 2014

(54) OPTICAL APPARATUS, AND METHOD OF ORIENTING A REFLECTIVE ELEMENT

(76) Inventors: Edwin Johan Buis, Belfeld (NL); Gosse Charles De Vries, Veldhoven (NL); Fidelus Adrianus Boon, Bavel (NL)

( * ) Notice: Subject to any disclaimer, the term of this patent is extended or adjusted under 35 U.S.C. 154(b) by 263 days.

(21) Appl. No.: 13/392,032

(22) PCT Filed: Apr. 9, 2010

(86) PCT No.: PCT/EP2010/054687
§ 371 (c)(1),
(2), (4) Date: Feb. 23, 2012

(87) PCT Pub. No.: WO2011/023423
PCT Pub. Date: Mar. 3, 2011

(65) Prior Publication Data
US 2012/0147345 A1    Jun. 14, 2012

Related U.S. Application Data

(60) Provisional application No. 61/236,803, filed on Aug. 25, 2009.

(51) Int. Cl.
*G03B 27/70* (2006.01)
*G03F 7/20* (2006.01)

(52) U.S. Cl.
CPC .................... *G03F 7/70116* (2013.01)
USPC .......................................................... 355/66

(58) Field of Classification Search
CPC ............ G03F 7/70075; G03F 7/70116; G02B 7/1821

USPC ..................... 355/66, 67; 359/198.1, 872
See application file for complete search history.

(56) References Cited

U.S. PATENT DOCUMENTS

| 4,449,788 | A  | * | 5/1984 | Suzuki .......................... 359/873 |
| 4,906,089 | A  | * | 3/1990 | Biondi et al. .................. 359/843 |
| 6,658,084 | B2 |   | 12/2003 | Singer |
| 6,939,016 | B1 | * | 9/2005 | Munyard et al. .............. 359/874 |

(Continued)

FOREIGN PATENT DOCUMENTS

| EP | 2 000 733    | 12/2008 |
| EP | 2000733   A2 | 12/2008 |

(Continued)

OTHER PUBLICATIONS

International Preliminary Report on Patentability for corresponding PCT International Patent Application No. PCT/EP2010/054687, mailed Mar. 8, 2012.

(Continued)

*Primary Examiner* — Hung Henry Nguyen
(74) *Attorney, Agent, or Firm* — Pillsbury Winthrop Shaw Pittman LLP

(57) ABSTRACT

An optical apparatus has a moveable reflective element and associated actuator. The actuator includes a first magnet which is connected to the moveable reflective element such that movement of the first magnet will cause the moveable reflective element to move, and a second magnet which is connected to a motor such that operation of the motor will cause the second magnet to move. The second magnet is positioned relative to the first magnet such that moving the second magnet will cause the first magnet to move.

22 Claims, 12 Drawing Sheets

(56) References Cited

U.S. PATENT DOCUMENTS

| | | |
|---|---|---|
| 7,053,981 B2 | 5/2006 | Bleeker |
| 7,585,082 B2 * | 9/2009 | Yamada ..................... 359/872 |
| 2005/0219497 A1 | 10/2005 | Bleeker |
| 2008/0239268 A1 | 10/2008 | Mulder et al. |

FOREIGN PATENT DOCUMENTS

| | | |
|---|---|---|
| JP | 2004-279948 | 10/2004 |
| JP | 2005-266713 | 9/2005 |
| JP | 2005-294837 | 10/2005 |
| JP | 2008-258605 | 10/2008 |
| WO | 2008/131930 | 11/2008 |
| WO | 2008/131930 A1 | 11/2008 |
| WO | 2011/023419 | 3/2011 |

OTHER PUBLICATIONS

International Search report for PCT International Patent Application No. PCT/EP2010/054687, mailed on Aug. 2, 2010.

* cited by examiner

OPTICAL APPARATUS, AND METHOD OF ORIENTING A REFLECTIVE ELEMENT

CROSS-REFERENCE TO RELATED APPLICATIONS

This application is the United States national phase entry of PCT/EP2010/054687, filed Apr. 9, 2010, which claims the benefit of U.S. provisional application 61/236,803, which was filed on 25 Aug. 2009, the contents of both of which are incorporated herein in their entireties by reference.

FIELD

The present invention relates to an optical apparatus which may form part of a lithographic apparatus, and to an associated method of orienting a reflective element.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC. This pattern can be transferred onto a target portion (e.g. comprising part of a die, one die, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through the beam in a given direction (the "scanning"-direction) while synchronously scanning the substrate parallel or anti-parallel to this direction.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A lithographic apparatus generally includes an illumination system. The illumination system receives radiation from a source, for example an excimer laser or an extreme ultra violet radiation source, and provides a radiation beam (sometimes referred to as a "projection" beam) which is incident upon a patterning device. The radiation beam is patterned by the patterning device, and is then projected by a projection system onto a substrate.

It is known in the art of lithography that an image of the patterning device projected onto a substrate can be improved by providing the radiation beam with an appropriate illumination mode. An illumination mode is a spatial intensity distribution of the radiation beam in a pupil plane of the illumination system, centred with respect to an axis or optical axis of the illumination system. At the plane of the patterning device (a field plane of the illumination system) such a spatial intensity distribution corresponds to a distribution of angles of incidence of incident radiation, referred to as an angular intensity distribution of radiation. A desired illumination mode may, for example, be a conventional illumination mode having a central irradiated portion in the pupil plane or an off axis illumination mode having one or more isolated, off axis irradiated portions in the pupil plane. Accordingly, an illumination system of a lithographic apparatus typically includes an intensity distribution adjustment apparatus arranged to direct, shape and control the radiation beam in the illumination system such that a selected illumination mode can be achieved.

The prior art describes an intensity distribution adjustment apparatus for use with an EUV lithographic apparatus arranged to control the illumination beam so as to achieve a desired illumination mode, see U.S. Pat. No. 6,658,084. The illumination system of the prior art EUV lithographic apparatus includes a reflective component comprising a plurality of reflective elements, each reflective element arranged to direct a sub-beam of EUV radiation to a location in a pupil plane, such that the plurality of elements provides effectively an annular illumination mode, whereby the inner and outer radii of the annular intensity distribution in the pupil plane are controllable. The magnitude of the inner and outer radii is usually indicated by σinner and σouter respectively. These numbers represent respectively the ratio of the inner radius and the ration of the outer radius to the radius corresponding to the numerical aperture of the projection system.

The optical elements of such an illumination system are located in a vessel providing a vacuum environment, so that the EUV radiation is not substantially absorbed by fluids when traversing the vessel. Some of the reflective elements may be movable or exchangeable in order to enable a change or control of an illumination mode. Therefore, there is the problem of reliably driving movable reflective elements of the illumination system in a vacuum environment.

SUMMARY

It is desirable to provide an optical apparatus comprising a moveable reflective element and associated actuator suitable for use in a vacuum environment.

According to an aspect, there is provided an optical apparatus comprising a moveable reflective element and associated actuator, the actuator comprising a first magnet which is connected to the moveable reflective element such that movement of the first magnet will cause the moveable reflective element to move, and a second magnet which is connected to a motor such that operation of the motor will cause the second magnet to move, wherein the second magnet is positioned relative to the first magnet such that moving the second magnet will cause the first magnet to move.

According to an aspect, there is provided a method of changing the orientation of a moveable reflective element, the method comprising using a motor to move a second magnet, using movement of the second magnet to move a first magnet via magnetic interaction between the first magnet and the second magnet, and using movement of the first magnet to change the orientation of the moveable reflective element via a connection between the first magnet and the moveable reflective element.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 including

FIG. 10 including

DETAILED DESCRIPTION

Figure 1:
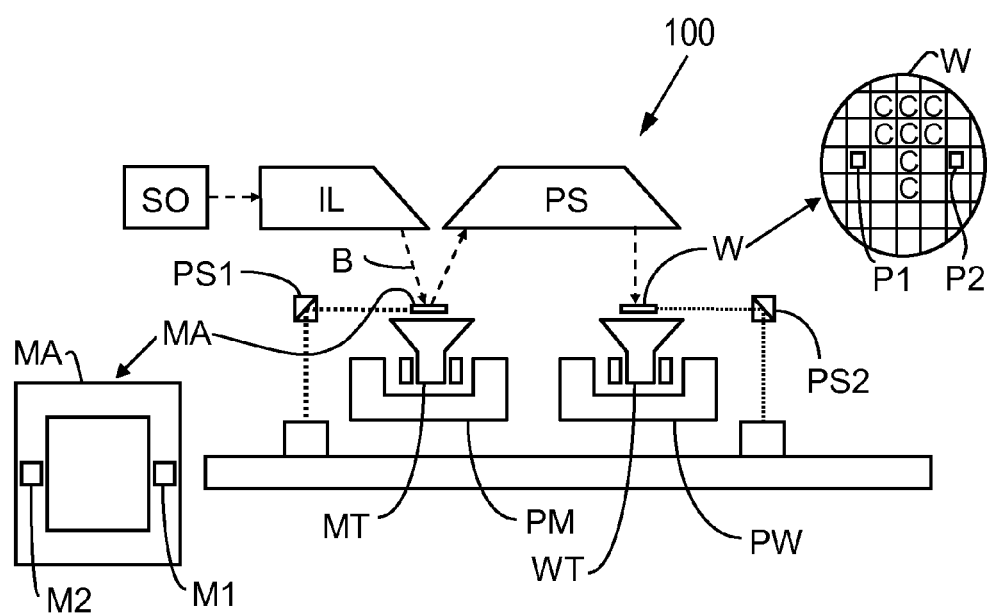
FIG. 1 schematically depicts a lithographic apparatus according to an embodiment of the invention.

FIG. 1 schematically depicts a lithographic apparatus 100 including a source collector module SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the afore mentioned outer and/or inner radial extent (with values σouter and σinner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired intensity uniformity and angular intensity distribution in its cross-section, as incident on the patterning device.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, the illumination system IL comprises an intensity distribution adjustment apparatus. The intensity distribution adjustment apparatus is arranged to adjust the spatial intensity distribution of the radiation beam at a pupil plane in the illumination system, in order to control the angular intensity distribution of the radiation beam incident on the patterning device. The intensity distribution adjustment apparatus may be used to select different illumination modes at the pupil plane of the illumination system. Selection of an illumination mode may for example depend upon properties of a pattern which is to be projected from the patterning device MA onto the substrate W. The spatial intensity distribution of the radiation beam at the illumination system pupil plane is converted to an angular intensity distribution before the radiation beam is incident upon the patterning device (e.g. mask) MA. It is appreciated that there is a Fourier relationship between the pupil plane of the illumination system and the patterning device MA (the patterning device is in a field plane). The pupil plane of the illumination system is a Fourier transform plane of the object plane where the patterning device MA is located, and it is conjugate to a pupil plane of the projection system.

Figure 2A:
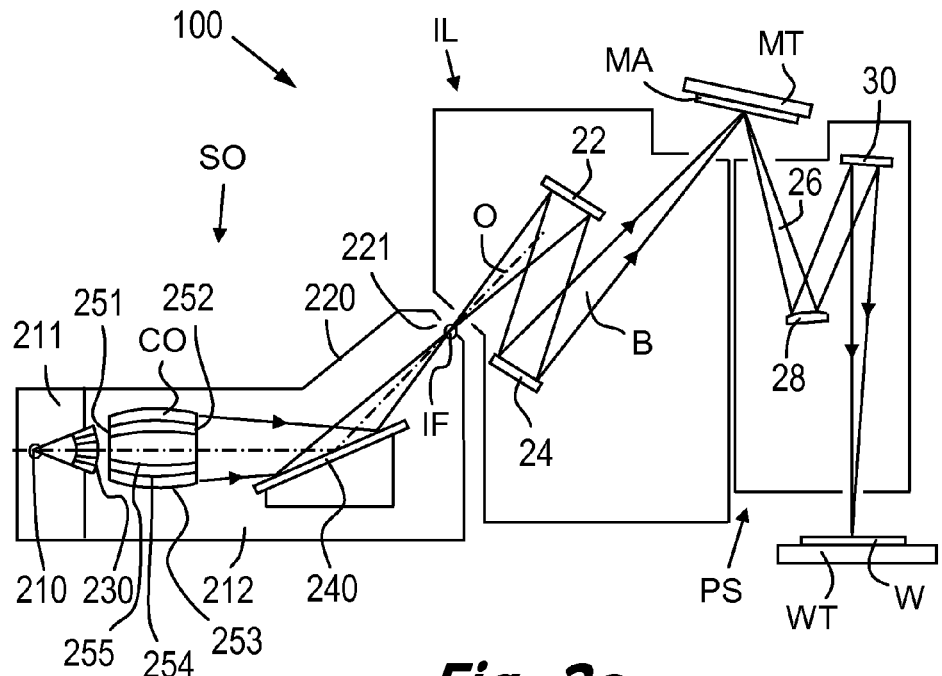
FIG. 2a schematically depicts part of the lithographic apparatus of FIG. 1 in more detail including a discharge produced plasma source.

FIG. 2a shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22, also referred to hereinafter as the first reflective component 22, and a facetted pupil mirror device 24, also referred to hereinafter as the second reflective component 24, arranged to provide a desired angular distribution of the radiation beam B, at the patterning device MA, as well as a desired uniformity of radiation intensity at the patterning device MA. Upon reflection of the beam of radiation B at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2a.

Collector optic CO, as illustrated in FIG. 2a, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 2B:
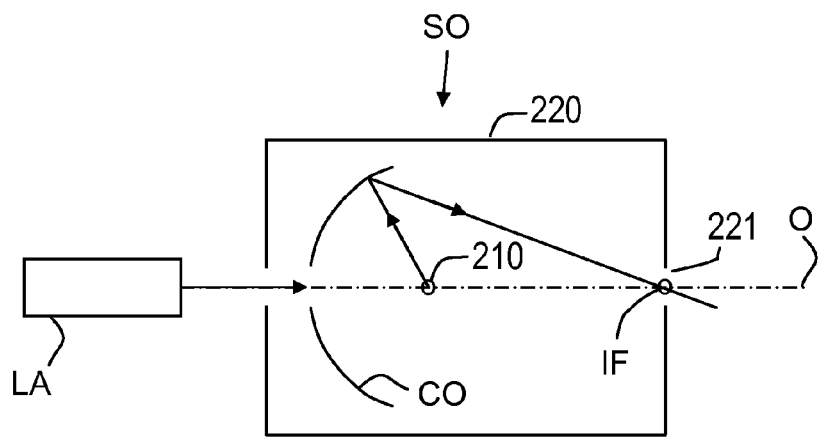
FIG. 2b schematically depicts part of the lithographic apparatus of FIG. 1 in more detail including a laser produced plasma source.

Alternatively, the source collector module SO may be part of an LPP radiation system as shown in FIG. 2b. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

Figure 3:
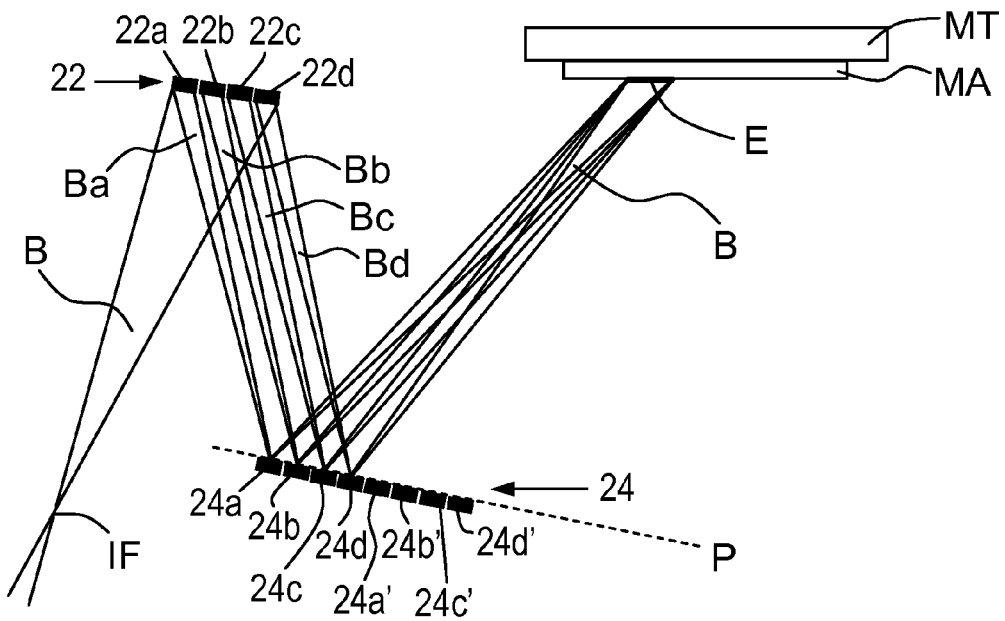
FIGS. 3 and 4 illustrate operation of moveable reflective elements of an illumination system of the lithographic apparatus.

FIG. 3 schematically shows part of the lithographic apparatus, including the first and second reflective components in more detail. The first reflective component 22 comprises a plurality of primary reflective elements including the primary reflective elements 22a, 22b, 22c and 22d. The second reflective component 24 comprises a plurality of secondary reflective elements including the secondary reflective elements 24a, 24b, 24c, 24d, and 24a', 24b', 24c', 24d'. Primary and secondary reflective elements may, hereinafter, also be referred to as field facet mirrors and pupil facet mirrors, respectively. The primary reflective elements 22a-d are configured to direct (reflect) radiation towards the secondary reflective elements 24a-d,a'-d'. Although only four primary reflective elements 22a-d are shown, any number of primary reflective elements may be provided. The primary reflective elements may be arranged in a two-dimensional array (or some other two-dimensional arrangement). Although only eight secondary reflective elements 24a-d,a'-d' are shown, any number of secondary reflective elements (the number being typically a multiple of the number of primary reflective elements) may be provided. The secondary reflective elements may be arranged in a two-dimensional array (or some other two-dimensional arrangement).

The primary reflective elements 22a-d have adjustable orientations, and may be used to direct radiation towards selected secondary reflective elements 24a-d,a'-d'.

The second reflective component 24 coincides with a pupil plane P of the illumination system IL or is disposed proximate to a pupil plane of the illumination system. The second reflective 24 component therefore acts as a virtual radiation source (also commonly referred to as a secondary radiation source) which directs radiation onto the patterning device MA. A further mirror (not shown) may be provided between the second reflective component 24 and the patterning device MA. The latter mirror may be a system of mirrors, and may be arranged to image the primary reflective elements 22a-d onto the plane wherein in use the patterning device MA is held by the substrate table MT.

The spatial intensity distribution of the radiation beam B at the second reflective component 24 defines the illumination mode of the radiation beam. Since the primary reflective elements 22a-d have adjustable orientations, they may be used to form different spatial intensity distributions at the pupil plane P, thereby providing different illumination modes.

In use, the radiation beam B is incident upon the primary reflective elements 22a-d of the first reflective component 22. Each primary reflective element 22a-d reflects a sub-beam of radiation towards a different, secondary reflective element 24a-d,a'-d' of the second reflective component 24. A first sub-beam Ba is directed by a first primary reflective element 22a to a first secondary reflective element 24a. Second, third and fourth sub-beams Bb, Bc and Bd are directed by second, third and fourth primary reflective elements 22b, 22c, and 22d respectively to second, third and fourth secondary reflective elements 24b, 24c, and 24d.

The sub-beams Ba-d are reflected by the secondary reflective elements 24a-d towards the patterning device MA. The sub-beams may together be considered to form a single radiation beam B which illuminates an illumination area E on the mask MA. The shape of the illumination area E is determined by the shape of the primary reflective elements 22a-d. In a scanning lithographic apparatus the illumination area E may for example be a rectangle or a curved band, which in the scanning direction has a width narrower than the width in a direction perpendicular to the scanning direction.

Each of the primary reflective elements 22a-d forms an image of the intermediate focus IF at a different secondary reflective element 24a-d,a'-d' of the second reflective component 24. In practice, the intermediate focus IF will be an image of the plasma source, the image having a finite diameter (e.g. 4-6 mm). Consequently, each primary reflective element 22a-d will form an image of the virtual source point IF which has a finite diameter (e.g. 3-5 mm) at the secondary reflective elements 24a-d,a'-d'. The secondary reflective elements 24a-d,a'-d' may each be arranged and constructed as a single pupil facet mirror having a diameter which is larger than the afore mentioned image diameter (to avoid radiation falling between secondary reflective elements and thereby being lost). The intermediate focus IF and images of the intermediate focus IF are shown as points in the figures for ease of illustration.

The primary reflective elements and the secondary reflective elements may have optical powers different from zero. For example, each primary reflective element 22a-d may form at or near an irradiated secondary reflective element a demagnified image of the virtual source point IF which is smaller than the virtual source point IF. Each one of the secondary reflective elements 24a-d,a'-d' may form an image of one of the primary reflective element 22a-d at or near the field plane wherein the patterning device is located during exposure of a substrate. These images are substantially overlapping and together form the illumination area E.

The orientation of the primary reflective elements 22a-d determines the illumination mode which is formed at the pupil plane P. For example, the primary reflective elements 22a-d may be oriented such that radiation sub-beams are directed at the four innermost secondary reflective elements 24c,d,a',b'. This would provide an illumination mode which could be considered to be a one-dimensional equivalent of a conventional (disk-shaped) illumination mode. Such a conventional illumination mode is characterized by an intensity distribution in the pupil plane having a portion with relatively high intensity which is centred at the optical axis O, surrounded by a portion of relatively low or even zero intensity, and may therefore be referred to, hereinafter, as a conventional "on axis" illumination mode. In an alternative example, the primary reflective elements 22a-d may be oriented such that radiation sub-beams are directed at two secondary reflective elements 24a-b at a left hand end of the second reflective component 24, and at two secondary reflective components 24c'-d' at a right hand end of the second reflective component. This would provide an illumination mode which could be considered to be a one-dimensional equivalent of, for example, an annular illumination mode. Such an illumination mode is characterized by an intensity distribution in the pupil plane having a portion with relatively low or even zero intensity which is centred at the optical axis O, surrounded by an area having at least one portion of relatively high intensity, and may therefore be referred to, hereinafter, as an "off axis" illumination mode.

Each of the primary reflective elements such as anyone of the elements 22a-d is configured such that it may be in one of two predetermined orientations: a first orientation and a second orientation. The first orientation is such that the primary reflective element reflects a sub-beam of radiation towards a selected secondary reflective element comprised within a first desired location on the second reflective component 24. The second orientation is such that the primary reflective element reflects the sub-beam of radiation towards a selected secondary reflective element comprised within a second desired location on the second reflective component 24. Further, each of the primary reflective elements such as any one of the field facets 22a-d illustrated in FIG. 3 is moveable between its associated first orientation and second orientation.

To indicate that a field facet mirror in its first orientation irradiates, in use, a particular pre-selected secondary reflective element which is specifically selected from the plurality of secondary reflective elements, reference is made hereinafter to a first "associated" secondary reflective element. Similarly, reference is made to the second "associated" secondary reflective element, it being the element irradiated when the field facet mirror is in its second orientation. Similarly, afore mentioned first and second desired locations are also referred to, hereinafter as the first and second "associated" locations.

Figure 4:
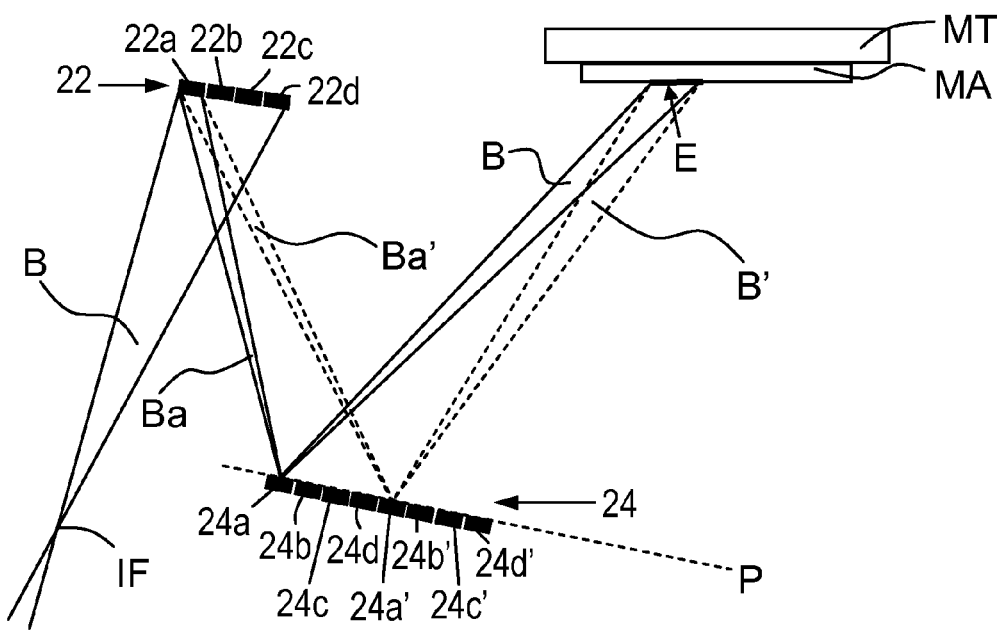

FIG. 4 illustrates the movement of a primary reflective element between first and second orientations, using as an example the first primary reflective element 22a of the first reflective component 22. When the first primary reflective element 22a is in a first orientation, it directs a radiation sub-beam Ba towards a first secondary reflective 24a of the second reflective component 24. When the first primary reflective element 22a is in a second orientation, it directs a radiation sub-beam Ba' (shown with dotted lines) towards a second secondary reflective 24a' of the second reflective component 24. The corresponding first and second locations are not shown explicitly in FIG. 4. In FIG. 4 the first and second locations may be assumed to coincide with the locations occupied by the first and second secondary reflective elements 24a and 24a' respectively. However, the first and second locations may be separate areas in the pupil plane P, and may each include a plurality of secondary reflective elements, as will be discussed in detail further below.

Each primary reflective element of a group of primary reflective elements such as the group of elements 22a-d may be arranged to direct a radiation sub-beam to a first location and a second location associated with each primary reflective element 22a-d, the first and second location being different and unique with respect to locations which receive radiation sub-beams from other primary reflective elements not belonging to the said group of primary reflective elements such as the group of elements 22a-d. By configuring each primary reflective element 22a-d appropriately, radiation may be directed towards the requisite locations at the second reflective component 24 so as to produce spatial intensity distributions which correspond with desired illumination modes.

Although FIGS. 3 and 4 show only four primary reflective elements 22a-d, the first reflective component 22 may comprise many more primary reflective elements. The first reflective component 22 may comprise for example up to 100, up to 200 or up to 400 primary reflective elements. The first reflective component 22 may comprise for example any number in the range of 100-800 primary reflective elements. The reflective elements may be mirrors. The first reflective component 22 may comprise an array of 1024 (e.g. 32×32) mirrors, or 4096 (e.g. 64×64) mirrors, or any suitable number of mirrors. The primary reflective elements may be arranged in a two-dimensional grid-like formation. The primary reflective elements may be arranged in a plane which crosses through the radiation beam.

The first reflective component 22 may comprise one or more arrays of primary reflective elements. For example, the primary reflective elements may be arranged or grouped to form a plurality of arrays, each array for example having 32×32 mirrors. In the text, the term "array" may mean a single array or a group of arrays.

The secondary reflective elements 24a-d,a'-d' may be mounted such that the orientations of the secondary reflective elements are fixed with respect to a mounting surface of the second reflective component.

Figure 5A:
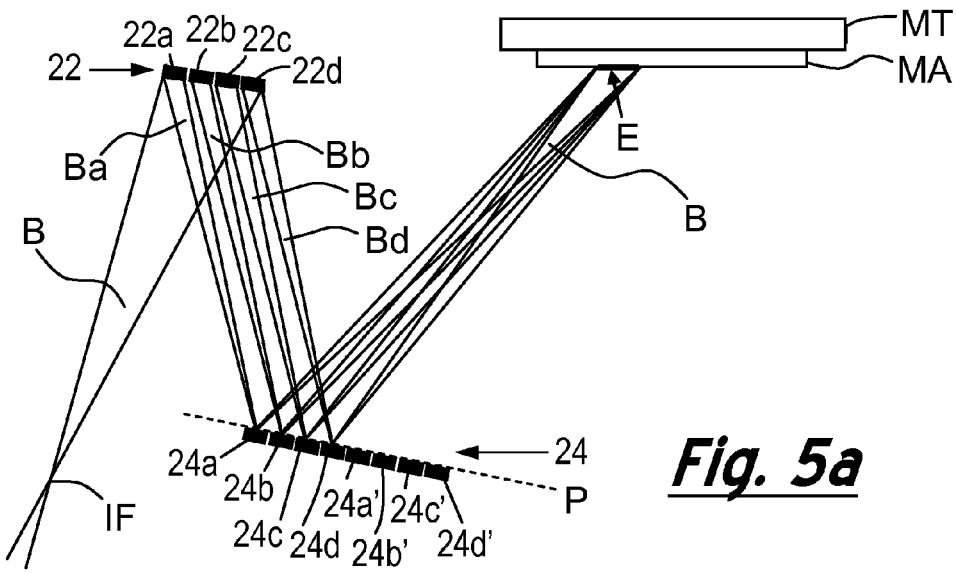
FIGS. 5a and 5b illustrate operation of moveable reflective elements of an illumination system of the lithographic apparatus, and a resulting y-dipole illumination mode.
Figure 5B:
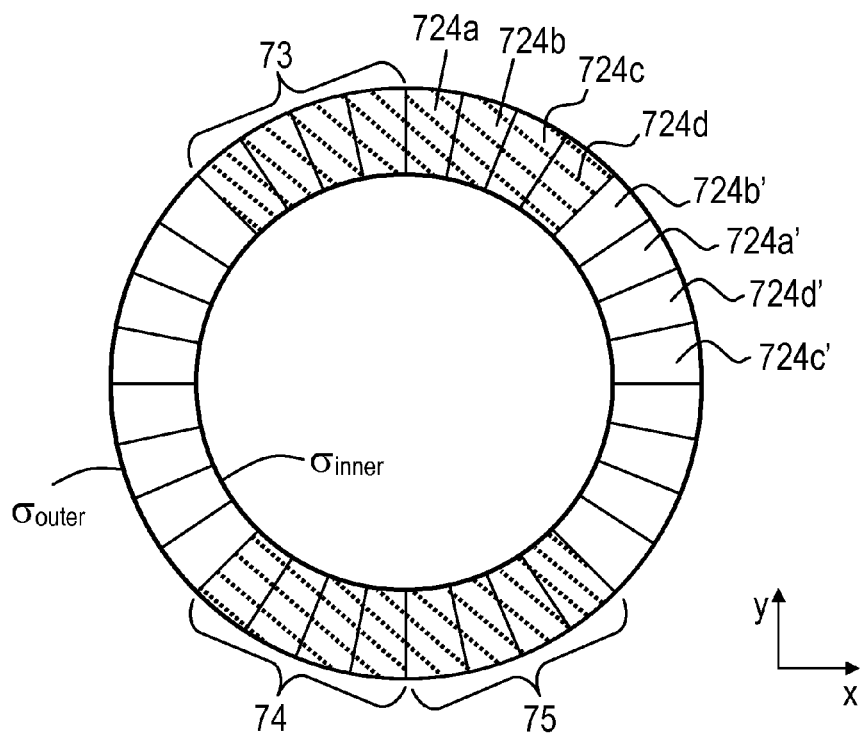
Figure 6A:
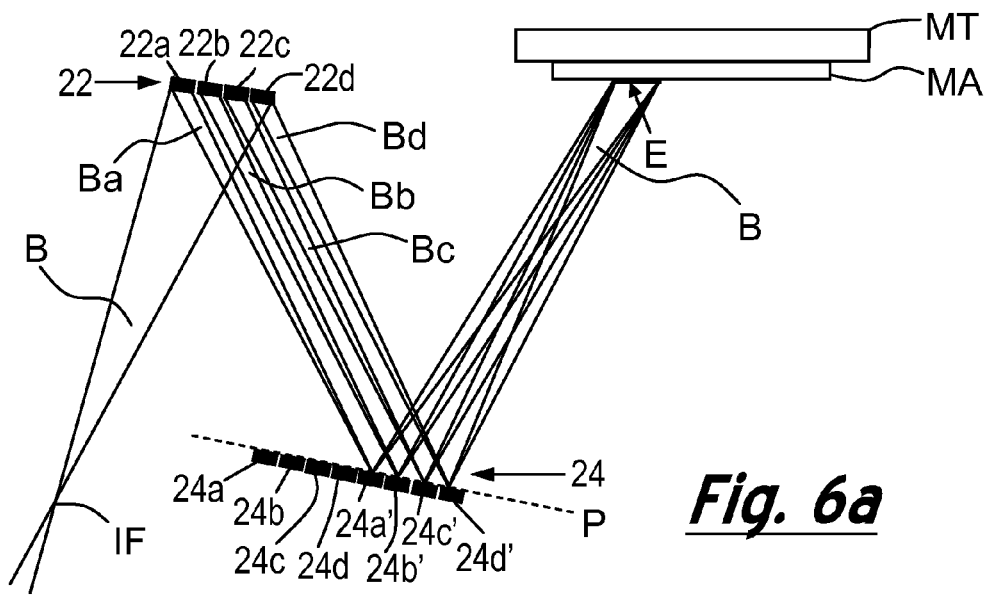
FIGS. 6a and 6b illustrate operation of moveable reflective elements of an illumination system of the lithographic apparatus, and a resulting x-dipole illumination mode.
Figure 6B:
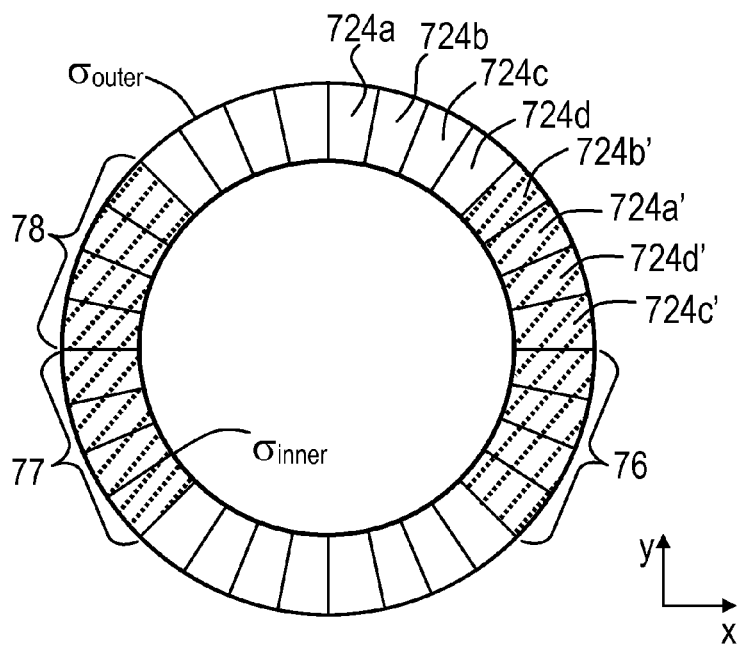

FIGS. 5 and 6 schematically illustrate the principle of redirecting radiation in order to change a spatial intensity distribution at the pupil plane P, and thereby obtain a desired illumination mode. The drawing planes of FIGS. 5b and 6b coincide with the pupil plane P shown in FIGS. 5a and 6a. Cartesian coordinates are indicated in FIGS. 5b and 6b in order to facilitate explanation of the figures. The indicated Cartesian coordinates are not intended to imply any limitation on the orientation of the spatial intensity distributions that may be obtained using the invention. The radial extent of the spatial intensity distributions is defined by σinner (inner radial extent) and σouter (outer radial extent). The inner and outer radial extents may be circular, or may have some other shape.

As explained above, the spatial intensity distribution (and hence illumination mode) of the radiation beam in the pupil plane P is determined by the orientations of the primary reflective elements such as the elements 22a-d. For example, an illumination mode may be provided and controlled by selecting and then moving each of the primary reflective elements 22a-d to either its first orientation or its second orientation as required.

In this example there are 16 primary reflective elements, only 4 of which are shown in FIGS. 5a and 6a (the primary reflective elements 22a-d). When the primary reflective elements 22a-d are in their respective first orientations, sub-beams Ba, Bb, Bc and Bd of radiation are reflected towards associated first locations 724a, 724b, 724c and 724d, as shown in FIG. 5b. These locations respectively comprise the secondary reflective elements 24a, 24b, 24c and 24d, shown in FIGS. 5a and 6a. Referring to FIG. 5b, the first locations 724a-d are at or close to the top of the figure. Other primary reflective elements (not illustrated) are also in their first orientations, and direct sub-beams of radiation to groups 73, 74, and 75 of adjacent first locations, which are at or close to the top of the figure, and at or close to the bottom of FIG. 5b. Locations which receive sub-beams of radiation are shaded using dotted lines. It can be seen from FIG. 5b that when the primary reflective elements 22a-d are in their first orientations and the other primary reflective elements (not illustrated) are also in their first orientations, a dipole illumination mode is formed in which the poles are separated in the y-direction.

When the primary reflective elements 22a-d are in their second orientations, sub-beams of radiation are reflected towards associated second locations 724a', 724b', 724c', and 724d', as shown in FIG. 6b. These locations respectively comprise the secondary reflective elements 24a', 24b', 24c' and 24d', shown in FIGS. 5a and 6a. Referring to FIG. 6b, the second locations 724a'-d' are at or close to the right hand side of the figure. The afore mentioned other primary reflective elements are also in their second orientations, and direct sub-beams of radiation to groups 76, 77, and 78 of adjacent second locations, which are at or close to the right hand side of the figure, and at or close to the left hand side of the figure. Locations which receive sub-beams of radiation are shaded using dotted lines. It can be seen from FIG. 6b that when the primary reflective elements 22a-d and the other primary reflective elements are in their second orientations, a dipole illumination mode is formed in which the poles are separated in the x-direction.

Switching from the y-direction dipole illumination mode to the x-direction dipole illumination mode includes moving each of the primary reflective elements 22a-d from the first orientation to the second orientation. Similarly, switching from the x-direction dipole illumination mode to the y-direction dipole illumination mode includes moving each of the primary reflective elements 22a-d from the second orientation to the first orientation.

Formation of other illumination modes may include moving some of the primary reflective elements 22a-d to their first orientation and some to their second orientation, as is explained further below. The first and second locations associated with each primary reflective element and the corresponding first orientation and second orientation of each primary reflective element may be chosen so as to maximise the number of useful illumination modes that can be produced.

The primary reflective elements may be moved between first orientations and second orientations by rotating them about predetermined axes. The primary reflective elements may be moved using actuators.

One or more primary reflective elements may be configured to be driven to rotate around the same predetermined axis. One or more other primary reflective elements may be configured to be driven to rotate around other predetermined axes.

In an embodiment, a primary reflective element comprises an actuator arranged to move the primary reflective element between the first orientation and the second orientation. The actuator may for example be a motor. The first and second orientations may be defined by end stops. A first end stop may comprise a mechanical apparatus which prevents the primary reflective element from moving beyond the first orientation. A second end stop may comprise a mechanical apparatus which prevents the primary reflective element from moving beyond the second orientation. A suitable mount for the primary reflective element, which includes end stops, is described further below.

Since movement of the primary reflective element is limited by end stops, the primary reflective element can be accurately moved to the first orientation or the second orientation without needing to monitor the position of the primary reflective element (e.g. without needing to use position monitoring sensors and a feedback system). The primary reflective elements may be oriented sufficiently accurately that they may form illumination modes of sufficient quality to be used in lithographic projection of a pattern from a patterning device onto a substrate.

A driver signal supplied to the actuator may be a binary signal. There is no need to use a more complex signal such as a variable analogue voltage or a variable digital voltage, since the actuator only needs to move the primary reflective element to a first end stop or to a second end stop. The use of a binary (two-valued) driver signal for the actuator, rather than a more complex system, allows a more simple control system to be used than would otherwise be the case.

The apparatus described above in relation to FIGS. 5 and 6 includes 16 primary reflective elements and 32 locations on the second reflective component 24. In practice, many more primary reflective elements may be provided. However, 16 primary reflective elements is a sufficient number to allow illustration of the way in which several different illumination modes may be obtained. The following illumination modes may be obtained using 16 primary reflective elements associated with respective 32 locations on the second reflective component 24: annular, c-quad, quasar, dipole-y and dipole-x. These illumination modes are formed by configuring the 16 primary reflective elements so as to appropriately direct radiation towards a desired selection of 16 of the 32 associated locations at the pupil plane of the illumination system. It is appreciated that the locations on the second reflective component 24 can effectively be specified and indicated as locations at the pupil plane of the illumination system, since the reflective surfaces of the pupil facet mirrors of the second reflective component 24 are disposed at or proximate to the pupil plane. For the sake of simplicity, no distinction is made hereinafter between a "location" on the second reflective component and a "location" at the pupil plane of the illumination system.

Figure 7:
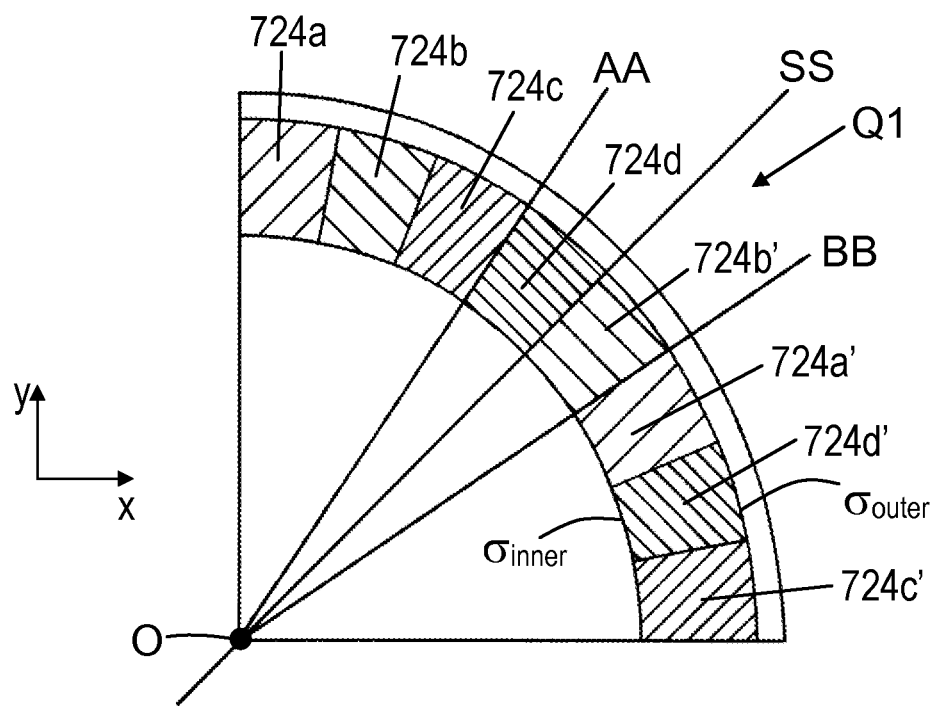
FIG. 7 depicts a first quadrant of a pupil plane.

FIG. 7 depicts a first quadrant Q1 of a pupil plane in an illumination system comprising a number of locations arranged in an annular shape circumferentially around an optical axis O intersecting the pupil plane. The illumination system is configured to produce the five different desired illumination modes. The locations 724*a-d*, 724*a'-d'* of the quadrant may receive radiation sub-beams Ba, Bb, Bc and Bd from the respective first reflective elements 22*a-d*. An inner radial extent of the illumination locations is labeled as $\sigma_{inner}$. An outer radial extent of the illumination locations is labeled as $\sigma_{outer}$. For simplicity, in FIG. 7 it is assumed that each location can be associated with just one secondary reflective element. In FIG. 7, the locations 724*a-d*, 724*a'-d'* are associated with the secondary reflective elements 24*a-d*, and the secondary reflective elements 24*a'-d'*, respectively.

It is appreciated, however, that alternatively a plurality of secondary reflective elements may be associated with each location. For example between 10 and 20 secondary reflective elements may be provided at each location. Where this is the case, the number of primary reflective elements scales accordingly. For example, if there are 10 secondary reflective elements at a given illumination location, then there are 10 primary reflective elements arranged to direct radiation to that location (each of the primary reflective elements being arranged to direct radiation to a different secondary reflective element within the location). In the following description, where the term 'primary reflective element' is used, this may encompass a plurality of primary reflective elements which are configured to move in unison.

The relative surface area of illumination locations across the pupil plane, i.e., the surface area of the constituent locations normalized by the pupil area corresponding to the numerical aperture of the projection lens, amounts to $(\sigma_{outer}^2 - \sigma_{inner}^2)/2$. Thus, the etendue ratio X which is defined as the inverse of the used pupil area follows as $X = 2/(\sigma_{outer}^2 - \sigma_{inner}^2)$.

In the quadrant Q1 depicted in FIG. 7, there are 8 locations including the respective 8 secondary reflective devices 24*a-d*, 24*a'-d'* (corresponding with 32 locations across the entire pupil plane). Each location is sized and shaped to be illuminated by a sub-beam of radiation reflected by a primary reflective element. Each primary reflective element is configured so as to separately illuminate two different locations from different parts of the same quadrant. More specifically, each primary reflective element is configured to move between a first orientation and a second orientation so as to direct radiation and thereby illuminate either a first associated location or a second associated location in the same quadrant, and hence to irradiate either a first associated secondary reflective element or a second associated secondary reflective element.

Although pairs of locations 724*a,a'*, 724*b,b'*, 724*c,c'* and 724*d,d'* are provided in the same quadrant Q1 in FIG. 7, it is not necessary that this is the case. For example, a first location may be provided in one quadrant, and the corresponding second location may be provided in a different quadrant. If the separation between the first and second locations of a pair of locations is increased, then the amount of rotation required by the primary reflective element in order to direct a radiation sub-beam to those locations will also increase. The positions of the locations may be selected such that the required rotation of the primary reflective elements is minimised, or that none of the primary reflective elements is required to rotate by more than a predetermined maximum rotation. The positions of the locations may be such that a desired set of illumination modes may be obtained (for example as explained further below in relation to FIG. 8).

A first primary reflective element 22*a* (see FIGS. 5 and 6) is configured to illuminate a first associated location 724*a* of the quadrant Q1 when orientated in a first orientation, and a second associated location 724*a'* of the quadrant when orientated in a second orientation. A second primary reflective element 22b is configured to illuminate a first associated location 724b when orientated in a first orientation and a second associated location 724b' when orientated in a second orientation. A third primary reflective element 22c is configured to illuminate a first associated location 724c when orientated in a first orientation and a second associated location 724c' when orientated in a second orientation. A fourth primary reflective element 22d is configured to illuminate a first associated location 724d when orientated in a first orientation and a second associated location 724d' when orientated in a second orientation.

An equivalent arrangement of the locations and associated primary reflective elements may apply for other quadrants (not illustrated).

Each primary reflective element may be moved between the first orientation and second orientation by rotating it about a predetermined axis. A plurality of primary reflective elements may be configured and arranged to be rotatable about the same axis. For example, pairs of primary reflective elements associated with pairs of adjacent locations in the same quadrant of the pupil plane may be configured so as to rotate about the same axis. In the illustrated example, the first and second primary reflective elements 22a, 22b associated with the pair of adjacent locations 724a and 724b, are configured to rotate about a first axis AA, and the third and fourth primary reflective elements 22c, 22d associated with the pair of adjacent locations 724c and 724d, are configured to rotate about a second axis BB. The first axis AA is arranged at 56.25° with respect to the x-axis in quadrant Q1, and the second axis BB is arranged at 33.75° with respect to the x-axis in quadrant Q1. Although the first and second axes AA, BB are shown in the plane of FIG. 7, this is for ease of illustration only. The axes are at or near the plane of the first reflective component 22, and more specifically at or near a plane containing pivot points of pairs of primary reflective elements 22a,b and 22c,d. The first and second axes AA, BB pass through an optical axis O of the illumination system.

Additionally or alternatively, primary reflective elements associated with corresponding locations in opposing quadrants of the pupil plane may be configured to rotate about the same axis. For example, primary reflective elements 22a,b associated with the first quadrant Q1 and corresponding primary reflective elements associated with a third quadrant may be configured to rotate about the first axis AA. Likewise, primary reflective elements 22c,d associated with the first quadrant Q1 and corresponding primary reflective elements associated with the third quadrant may be configured to rotate about the second axis BB.

Primary reflective elements associated with a second quadrant, and primary reflective elements associated with a fourth quadrant, may be rotated about a third axis (e.g. arranged at 123.75° with respect to the x axis). In addition, primary reflective elements associated with the second quadrant and primary reflective elements associated with the fourth quadrant may be rotated about a fourth axis (e.g. arranged at 146.25° with respect to the x axis). Neither of these quadrants are shown in FIG. 7.

The primary reflective elements may be configured to rotate in the same direction or opposite directions about same axis.

When primary reflective elements are grouped together to rotate about the same axis, and to rotate in the same direction, an actuator arranged to move the primary reflective elements between their first and second orientations may be simplified. For example, an actuator associated with primary reflective elements that are grouped to rotate about the same axis may be arranged to move those primary reflective elements in unison. Thus, in an embodiment in which there are four predetermined axes of rotation, there may be four actuators.

FIG. 8 shows how five different illumination modes may be formed at the pupil plane of the illumination system, using the described apparatus (i.e. using 16 primary reflective elements and 4 axes of rotation). The illumination modes are as follows: annular illumination mode (FIG. 8a), dipole-x illumination mode (FIG. 8b), dipole-y illumination mode (FIG. 8c), quasar illumination mode (FIG. 8d) and c-quad illumination mode (FIG. 8e).

Figure 8A:
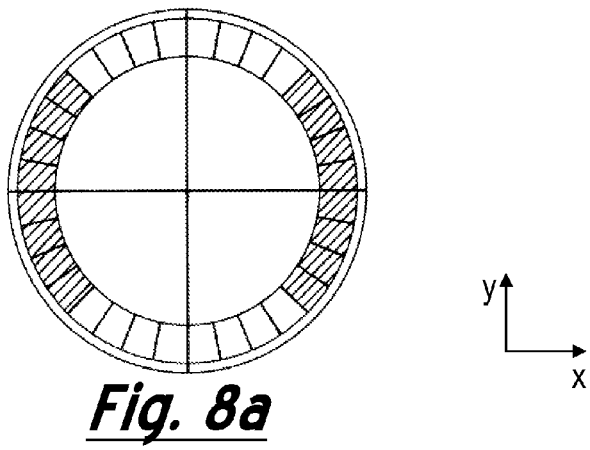
FIGS. 8a, 8b, 8c, 8d, and 8e depicts five respective illumination modes obtainable using an embodiment of the invention.

To produce the annular illumination mode, as shown in FIG. 8a, the primary reflective elements 22a-d associated with the first quadrant are oriented such that locations 724b, 724d, 724a' and 724c' are illuminated. This is achieved by rotating the first primary reflective element 22a around the first axis AA to its second orientation, rotating the second primary reflective element 22b around the first axis AA to its first orientation, rotating the third primary reflective element 22c around the second axis BB to its second orientation, and rotating the fourth primary reflective element 22d around the second axis BB to its first orientation. The primary reflective elements associated with the locations of the second, third and fourth quadrants are similarly orientated.

Figure 8B:
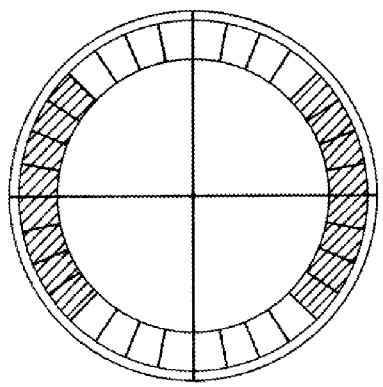

To produce a dipole-x illumination mode, as shown in FIG. 8b (see also FIG. 6b), the primary reflective elements associated with the first quadrant are orientated such that locations 724b', 724a', 724d' and 724c' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its second orientation, and rotating the fourth primary reflective element 22d around the second axis BB to its second orientation. The primary reflective elements associated with the locations of the second, third and fourth quadrants are similarly orientated.

Figure 8C:
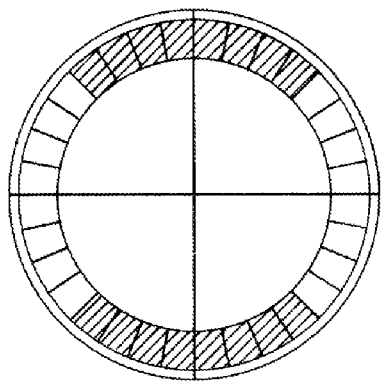

To produce a dipole-y illumination mode, as shown in FIG. 8c (see also FIG. 5b), the primary reflective elements associated with the first quadrant are orientated such that locations 724a, 724b, 724c and 724d are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its first orientation, and rotating the fourth primary reflective element 22d around the second axis BB to its first orientation. The primary reflective elements associated with the locations of the second, third and fourth quadrants are similarly orientated.

Figure 8D:
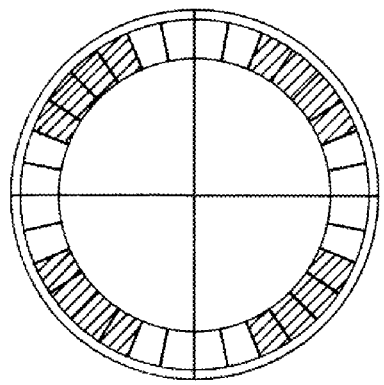

To produce a quasar illumination mode, as shown in FIG. 8d, the primary reflective elements associated with the first quadrant are orientated such that locations 724c, 724d, 724b' and 724a' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its first orientation, and rotating the fourth primary reflective element 22d around the second axis BB to its first orientation. The primary reflective elements associated with the locations of the second, third and fourth quadrants are similarly orientated.

Figure 8E:
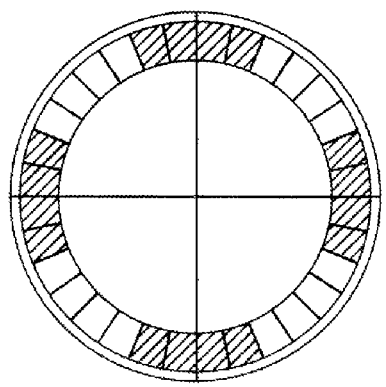

To produce a c-quad illumination mode, as shown in FIG. 8e, the primary reflective elements associated with the first quadrant are oriented such that locations 724a, 724b, 724d' and 724c' are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its second orientation and rotating the fourth primary reflective element 22d around the second axis BB to its second orientation. The primary reflective elements associated with the locations of the second, third and fourth quadrants are similarly orientated. In any of the above examples it is appreciated that illumination of a location (on the secondary reflective component) includes directing a sub beam of radiation to the corresponding secondary reflective element.

In the above description of the illumination modes shown in FIG. 8, it has been mentioned that the primary reflective elements associated with the locations of the second, third and fourth quadrants are orientated similarly to the first quadrant. The following explains the manner in which this is done. It can be seen from FIG. 8 that the dipole, quasar and c-quad modes are symmetric about the x and y axes. The annular mode of FIG. 8a however is not symmetric about the x and y axes, although it is rotationally symmetric (for rotations of 90° or multiples thereof).

According to an aspect of the invention it is appreciated that, when desired illumination modes do not share a same symmetry, the positions of the locations may be arranged such that each pair of locations has an associated pair of locations, and the two pairs are symmetric about a line SS which bisects the quadrant (see FIG. 7). For example, the first pair of locations 24a,a' is associated with the third pair of locations 24c,c'. These two pairs are symmetric about the line SS. The second pair of locations 24b,b' is associated with the fourth pair of locations 24d,d'. These two pairs are also symmetric about the line SS. The same constraint is applied to the other quadrants.

The second quadrant is a mirror image of the first quadrant. The third and fourth quadrants are mirror images of the first and second quadrants. Positioning the locations in this manner allows all of the illumination modes shown in FIG. 8 to be achieved. When any of the illumination modes shown in FIGS. 8b-d are to be produced, the orientations of corresponding primary reflective elements for each quadrant are the same. When the annular mode of FIG. 8a is to be produced, the orientations of the primary reflective elements for the first and third quadrants are opposite to those applied to the primary reflective elements for the second and fourth quadrants.

Although the above Figures show only a small number of primary reflective elements, a significantly larger number of primary reflective elements may be used. The first reflective component 22 may comprise for example up to 100, up to 200, up to 400 or more primary reflective elements. The primary reflective elements may be arranged in a two-dimensional grid-like formation. The primary reflective elements may be arranged in a plane which crosses through the radiation beam. Each primary reflective element may direct radiation towards a small portion of a given illumination location. For example, referring to FIG. 7, the first illumination location 24a may be subdivided into a plurality of portions (e.g. tens of portions), each of which receives radiation from a different primary reflective element.

The primary reflective elements may be mirrors, or any other suitable reflective elements.

Figure 9:
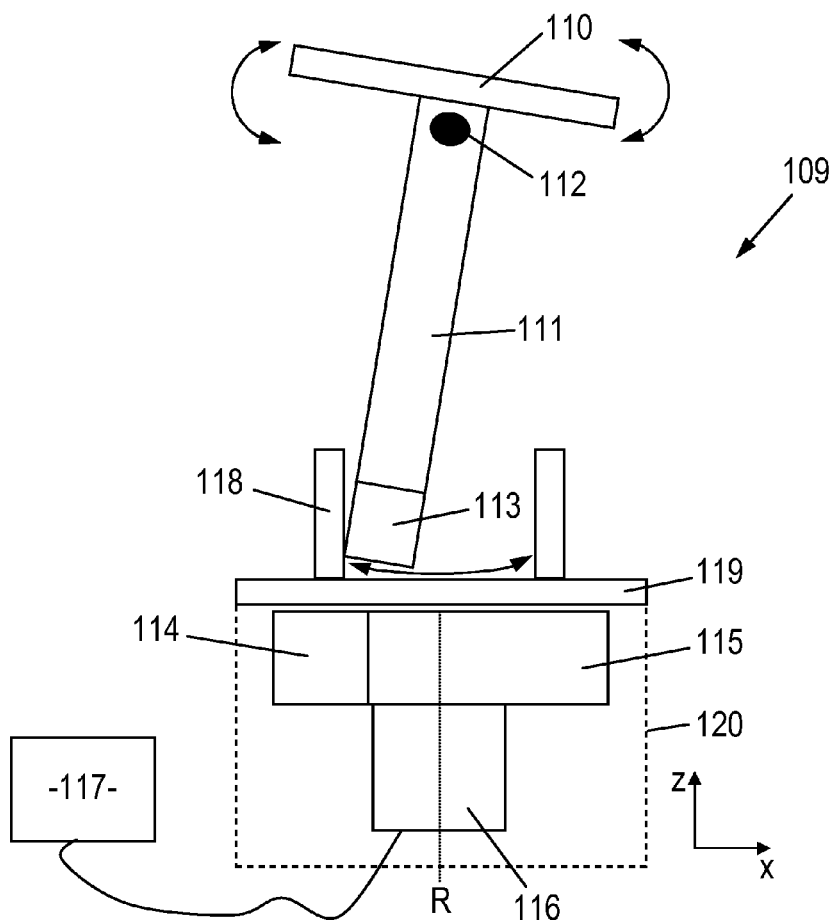
FIGS. 9 and 11 show a moveable reflective element and actuator according to an embodiment of the invention.

FIG. 9 shows an actuator 109 for a mirror 110 according to an embodiment of the invention. The mirror 110 is one of the aforementioned plurality of primary reflective elements of the reflective component 22 shown in FIG. 3. In particular, the mirror 110 may be one of the primary reflective elements 22a-d. The actuator may be used to rotate the mirror 110 between first and second orientations.

The actuator 109 comprises a rod 111 on which the mirror 110 is provided, the rod being rotatably mounted on a pivot 112. Double-headed arrows in FIG. 9 show the direction of rotation of the rod 111 and the mirror 110. The rod 111 is resiliently biased by one or more springs (not shown) towards a central position (e.g. a vertical position of the rod 111 in FIG. 9). Rotation of the rod 111 about the pivot 112 causes the mirror 110 to rotate, since the mirror is fixed to the rod. A magnet 113 is located at the lowermost end of the rod 111. This magnet is hereafter referred to as the rod magnet 113.

A magnet 114 is held in a rotatable mount 115. This magnet is hereafter referred to as the actuating magnet 114. The rotatable mount 115 is driven to rotate about an axis R by a motor 116 which is located adjacent to the rotatable mount. The motor 116 is controlled by a controller 117.

The rod magnet 113 is attracted to the actuating magnet 114, and so moves towards the actuating magnet. Movement of the rod magnet 113 towards the actuating magnet 114 is limited by an end stop 118, as shown in FIG. 9. When the actuating magnet 114 is in the position shown in FIG. 9, the rod 111 will be in the position shown in FIG. 9. This may be considered to be, for example, the first position of the rod 111, which may correspond with the first orientation of the mirror 110.

The rod 111 may be retained in the first position for example by continuing to supply power to the motor 116 such that the motor pushes the rod 111 against the end stop 118.

The motor 116 may include gearing which is sufficiently stiff to keep the rod 111 in the first position when the motor is switched off. If the rod 111 is resiliently biased to a position between the first and second positions, then the gearing may be sufficiently stiff to prevent the resilient bias moving the rod 111 away from the first position.

A sheet of non-magnetic material 119 is also shown in FIG. 9. The sheet 119 seals the mirror 110, rod 111 and rod magnet 113 from the actuating magnet 114, rotatable mount 115 and motor 116. The seal prevents contamination which arises from the actuating magnet 114, rotatable mount 115 and motor 116 from entering other parts of the lithographic apparatus. Contamination may, for example, comprise particles emitted from the motor from time to time, or hydrocarbon compounds released as gas from grease used in a bearing of the motor (a process known as outgassing). If this contamination were to be deposited on the surface of the mirror 110, then it would reduce the reflectivity of the mirror. The seal prevents this from happening. Since the sheet 119 is formed from non-magnetic material, the sheet does not interfere with the magnetic interaction between the actuating magnet 114 and the rod magnet 113.

The sheet 119 may be, for example, of stainless steel, or any other suitable material. The material may be, for example, a metal or some other material which does not give rise to large amounts of outgassing.

The sheet 119 may form part of a sealed enclosure (indicated by a dashed line 120) within which the actuating magnet 114, rotatable mount 115 and motor 116 are located. The mirror 110, rod 111 and rod magnet 113 may be surrounded by hydrogen (or some other gas) which is provided at low pressure (e.g. 5 Pa or less). Providing the actuating magnet 114, rotatable mount 115 and motor 116 in a sealed enclosure prevents the hydrogen from coming into contact with them. This avoids the possibility that the hydrogen affects the operation of the magnets 114, 115 or a magnet present in the motor 116.

Figure 10A:
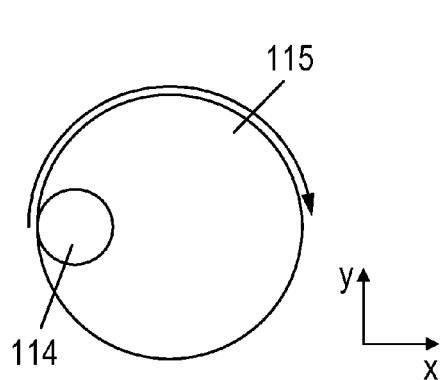
FIGS. 10a and 10b shows part of the actuator viewed from above.

FIG. 10 shows the actuating magnet 114 and rotatable mount 115 viewed from above. FIG. 10a shows the rotatable mount 115 in a first position, such that the actuating magnet 114 is at the left hand side (negative x-direction) of the Figure. This corresponds to the position of the rotatable mount 115 shown in FIG. 9.

The rotatable mount 115 may be rotated through 180°, as indicated by the arrow in FIG. 10a. Rotation of the rotatable mount 115 through 180° moves the rotatable mount to a second position, shown in FIG. 10b, such that the actuating magnet 114 is at the right hand side (positive x-direction) of the Figure. The rotatable mount 115 may be returned to the first position by rotating the rotatable mount back through the 180°, as indicated by the arrow in FIG. 10b.

Figure 11:
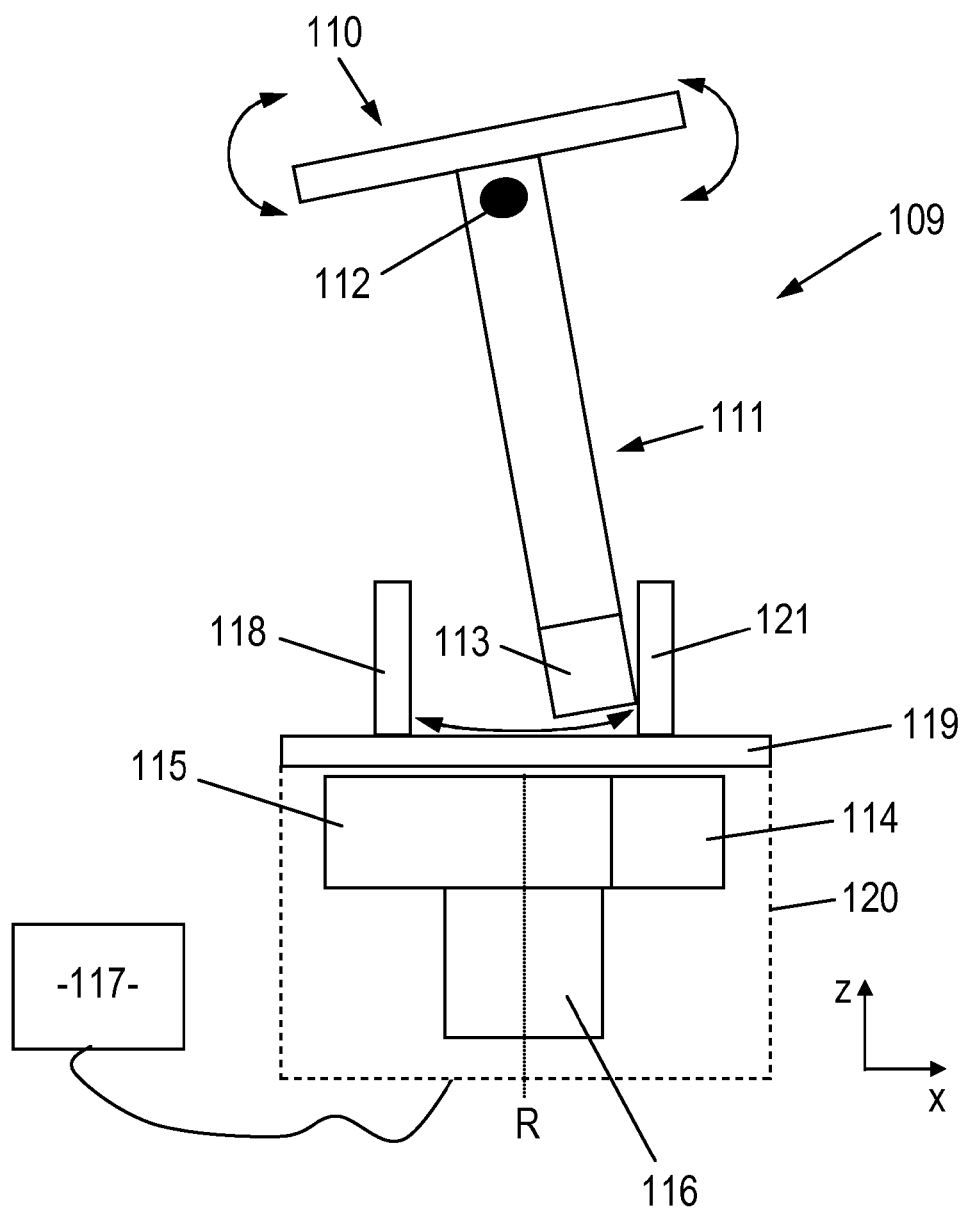

FIG. 11 shows the actuator 109 when the rotatable mount 115 is in the second position. The actuating magnet 114 is to the right of FIG. 11. Since the rod magnet 113 is attracted to the actuating magnet 114, the rod magnet moves towards the actuating magnet until its movement is stopped by an end stop 121. The position of the rod 111 shown in FIG. 11 may be considered to be, for example, the second position of the rod 111, which may correspond with the second orientation of the mirror 110.

As mentioned above, the sheet 119 forms part of a sealed enclosure 120 within which the actuating magnet 114, rotatable mount 115 and motor 116 are located. The actuator 109 and mirror 110 may be one of a plurality of actuators and mirrors provided in an array. Where this is the case, a plurality of actuating magnets, rotatable mounts and motors may all be located within the same enclosure. The enclosure may hold all of the actuating magnets, rotatable mounts and motors of the array, or a subset of the actuating magnets, rotatable mounts and motors of the array.

The enclosure may be formed from stainless steel, or any other suitable material. The material may be non-magnetic. The material may be, for example, a metal or some other material which does not give rise to large amounts of outgassing.

The controller 117 may be located within the enclosure, or may be located outside of the enclosure. A single controller may be used to control a plurality of motors. Alternatively, each motor may be controlled by a different controller.

Where a plurality of motors are provided within a sealed enclosure, one or more wires may be used to carry control signals for each motor into the sealed enclosure. It may be desired to reduce the number of wires which pass into the sealed enclosure. This may be achieved by multiplexing the control signals and passing the multiplexed control signals into the sealed enclosure via a reduced number of wires. The control signals may then be demultiplexed using a demultiplexer located within the sealed enclosure. Control signals may then be passed to the motors. The demultiplexer may form part of the controller.

In an alternative arrangement, each actuating magnet 114, rotatable mount 115 and motor 116 may be located in individual sealed enclosures.

Although the actuating magnet 114 is shown as being held within the rotatable mount 115, the actuating magnet may extend beyond the rotatable mount. For example, the actuating magnet may be located on the rotatable mount. Although the rotatable mount 115 is shown as being circular, the rotatable mount may have any suitable shape. The rotatable mount displaces the actuating magnet 114 away from the axis of rotation R of the motor 116. The rotatable mount 115 may be, for example, an arm which extends transverse to the axis of rotation R of the motor 116. The motor may be, for example, any suitable type of rotary motor which provides rotation about the axis of rotation R.

Although the actuating magnet 114 is shown as being cylindrical, the actuating magnet may have any suitable form. For example, the actuating magnet may be arcuate, square or rectangular.

Figure 12:
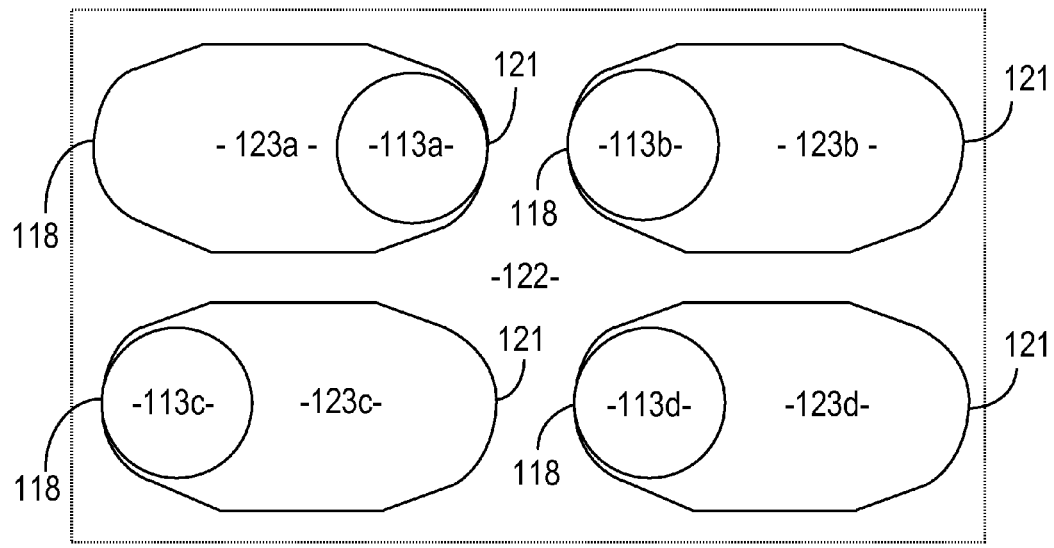
FIG. 12 shows a plate which forms part of an embodiment of the invention.

The end stops 118, 121 are shown in FIGS. 9 and 11 as blocks which extend outwardly from the sheet 119. However, this is merely an example, and the end stops may take any suitable form. For example, the end stops may take the form of an opening provided in a plate of material. FIG. 12 shows, viewed from above, an example of a plate 122 which includes four openings 123a, 123b, 123c, and 123d. Each opening 123a-d provides respective end stops 118, 121 for four respective rod magnets 113a, 113b, 113c and 113d. Edges of the plate 122 are shown schematically by a dotted line.

The end stops 118, 121 are formed by the peripheries of the openings 123. In this example, the rod magnets 113a-d are circular in cross-section, and the peripheries of the openings 123 are provided at either end with a curved portion. The curved portions have a radius of curvature which is greater than the radius of curvature of the rod magnets 113a-d. This provides a single point of contact for the rod magnet on the opening. Providing a single point of contact reduces the likelihood that the rod magnet 113 will slide between points of contact. This in turn reduces the likelihood that contamination is generated during sliding between points of contact.

In FIG. 12, one of the rod magnets 113a is in the second position, and is in contact with an end stop 121 provided at the right hand end of the periphery of the opening 123. The remaining three rod magnets 113b-d are in the first position, and are each in contact with an end stop 118 provided at the left hand end of the periphery of the opening 123.

The openings 123 are sufficiently wide that there is no significant likelihood of the rod magnet 113a-d touching a side of an opening when moving between the first and second positions (touching a side of an opening might cause contamination to be emitted from the rod magnet or the opening).

The plate 122 may be larger than this, and may for example include a multiplicity of openings. A single plate 122 may for example be used to provide end stops for all of the actuators of a mirror array.

Although the openings 123 shown in FIG. 12 all have the same orientation, different openings may have different orientations. Providing an opening with a different orientation will allow an actuator to move along a different path, thereby allowing rotation of an associated mirror 110 to take place about a different axis. Referring to FIG. 7 for example, it may be desired to rotate a first mirror about an axis AA and a second mirror about an axis BB. Appropriately oriented openings, together with appropriately oriented rod pivots, may be used to achieve this.

The rod pivot 112 (see FIG. 9) may constrain movement of the rod 111 and rod magnet 113 such that they move in a linear direction which is transverse to the orientation of the pivot. For example, in FIG. 9 the pivot 112 has an axis which is parallel to the y-direction, and the rod 111 is constrained to move in the x-direction. However, it is not necessary that the pivot has an axis which is parallel to the y-axis. The pivot may have an axis which extends in any suitable direction (e.g. the axes AA, BB shown in FIG. 7).

The rod pivot 112 may be arranged such that it does not constrain the rod 111 and rod magnet 113 to move in a linear direction, but instead provides some freedom for them to also move in a transverse direction. Where this is the case, end stops may be used to determine the first and second positions of the rod 111 and rod magnet 113 in two directions. An example of this is explained in relation to FIG. 13.

Figure 13:
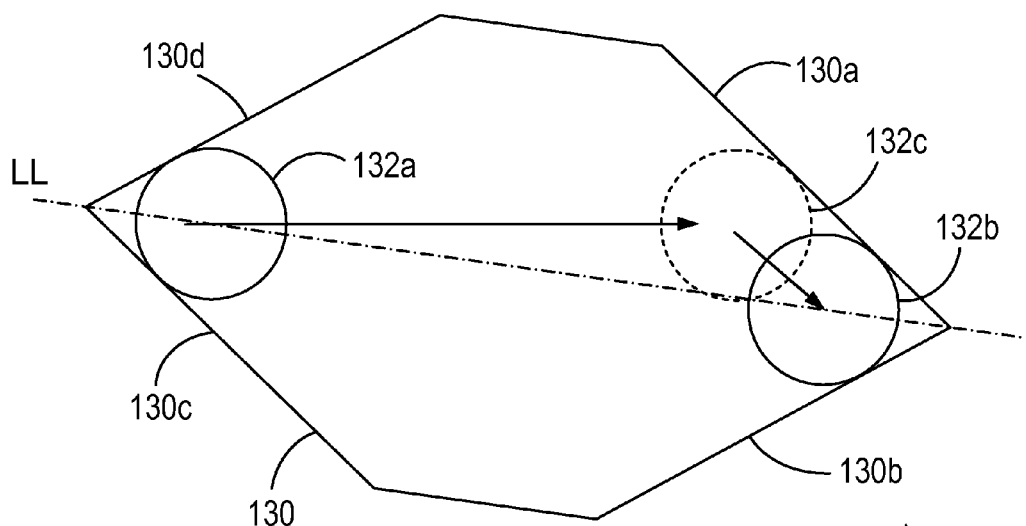
FIG. 13 shows an opening which forms part of an embodiment of the invention.

FIG. 13 shows an opening 130 provided in a plate (edges of the plate are not shown). A rod magnet 132 is shown moving from a first position 132a to a second position 132b. The first position 132a and second position 132b lie on an axis LL. The axis LL has been chosen to provide desired first and second orientations of a mirror (not shown) which is actuated by the rod magnet 132.

The rod magnet is moved from the first position 132a by an actuating magnet (not shown). The rod magnet is connected via a rod to a pivot which allows the rod magnet to move in the x-direction, and also provides some freedom for the rod magnet to move in the y-direction. Although the rod magnet is free to move in the y-direction, it may be resiliently biased such that it preferentially moves in the x-direction. Thus, the rod magnet may move in the x-direction until it comes into contact with a wall 130a of the opening 130 (as indicated by a circular dashed line 132c). The rod magnet may then travel along the wall 130a of the opening 130 until it comes into contact with a second wall 130b. The first wall 130a and the second wall 130b of the opening 130 together determine the second position 132b of the rod magnet.

When the rod magnet moves to the first position 132a, the first position is determined by a third wall 130c and a fourth wall 130d of the opening 130.

The shape and orientation of the opening 130 may be used to determine the first and second positions of the rod magnet. For example, making the opening 130 longer will increase the amount of rotation undergone by the mirror between the first and second orientations. Changing the orientation of the opening 130 will change the orientation of the axis LL which connects the first and second positions of the rod magnet (and thus change the axis of rotation of the mirror). A plate within which the opening 130 is provided may be manufactured with sufficient precision to allow selection of desired first and second positions of each rod 111 and associated first and second orientations of each mirror 110.

The opening 130 may have any suitable shape. For example, walls of the opening may be curved rather than straight, ends of the opening may form corners or may be rounded, etc.

The rod magnet 132 may be provided with a bearing (e.g. a ball-bearing) which is configured to roll along walls 130a-d of the opening 130 rather than slide along them. This may help to reduce the likelihood that contamination is released from the walls 130a-d or from the rod magnet 132.

Although only a single opening is shown in FIG. 13, the opening may be one of a plurality of openings provided in a plate.

In the described embodiments, the rod magnet 113 comes into contact with an end stop. However, some other part of the rod may 111 may come into contact with an end stop instead. For example the rod magnet 113 may be held within an enclosure which forms part of the rod 111, and it may be the enclosure which comes into contact with the end stop.

In the described embodiments, the rod magnet 113 and the actuating magnet 114 are configured such that they attract one another. However, the rod magnet 113 and the actuating magnet 114 may be configured such that they repel one another. Where this is the case, actuation will take place in an analogous manner to that described above, except that the actuating magnet 114 will push the rod magnet 113 between the first and second positions rather than pulling the rod magnet between the first and second positions.

Figure 10B:
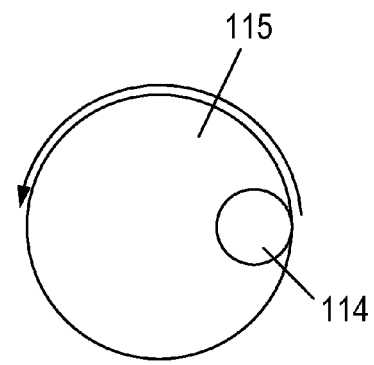

End stops (not shown) may be used to prevent the rotatable mount 115 from rotating beyond desired positions (e.g. the positions shown in FIGS. 10a and 10b). Where this is the case there is no need for the motor 116 to accurately control the position of the rotatable mount 115, since this is provided by the end stops. The motor 116 may for example be a conventional electrical motor. The motor 116 may for example be a brushless motor.

The motor 116 may be used to control the orientation of the rotatable mount 115 such that end stops are not required for the rotatable mount. The motor 116 may be, for example, a stepper motor which is used to control the orientation of the rotatable mount 115.

In FIG. 10a the rotatable mount 115 is shown rotating in a clockwise direction from the first position to the second position. The rotatable mount 115 may instead rotate in an anti-clockwise direction from the first position to the second position.

In the described embodiment, movement of the actuating magnet 114 is achieved by rotating a rotatable mount 115 which displaces the magnet away from the axis of rotation of a motor 116. However, other ways of moving the actuating magnet 114 may be used. For example, the motor may be arranged to drive a crank shaft on which the actuating magnet has been mounted. Alternatively, the motor may drive a cog, which in turn drives a toothed bar (rack) to which the actuating magnet is connected. In a further example, the actuating magnet may be actuated by a linear motor which is configured to move the actuating magnet in a linear manner from the first position to the second position.

In a further arrangement (not illustrated), a bimetal motor may be used to move the actuating magnet. The bimetal motor may comprise a bimetal strip having an actuating magnet provided at one end. The bimetal strip may be configured such that it moves the actuating magnet between the first and second positions in response to current being applied to the bimetal strip.

Magnetic screening may be provided in order to reduce the effect of an actuating magnet on one or more rod magnets which are adjacent to the actuating magnet but not intended to be actuated by the actuating magnet. Some magnetic screening may be provided, for example, by the plate 122 in which the openings 123a-d are provided. This may be achieved for example by forming the plate 122 from ferromagnetic material.

The magnets 113, 114 may be made from any suitable material. One or more of the magnets may contain neodymium. For example, one or more of the magnets may be made from a compound containing iron, boron and neodymium.

Figure 14A:
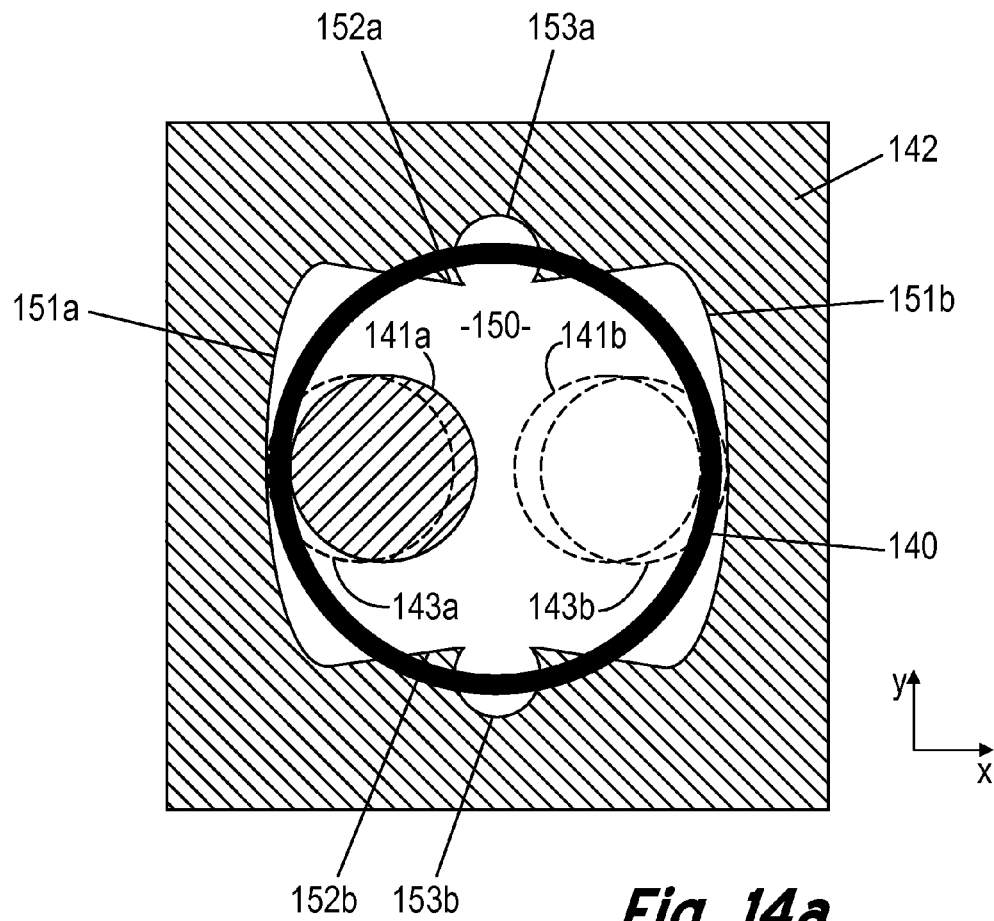
FIG. 14 including FIG. 14a and FIG. 14b shows a magnetic screen which may form part of the actuator according to an embodiment of the invention.
Figure 14B:
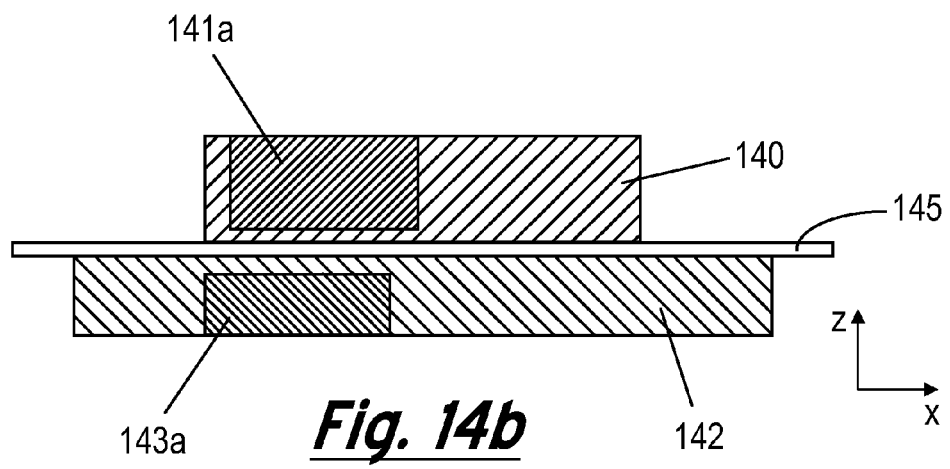

An embodiment of the invention in which magnetic screening is provided is shown schematically in FIG. 14. FIG. 14a shows, viewed from above, magnetic screening which comprises a rod magnet screen 140 and an actuating magnet screen 142, and a rod magnet (the rod magnet being shown in a first position 141a and a second position 141b). FIG. 14a also shows an actuating magnet in an associated first position 143a and second position 143b. FIG. 14b shows the rod magnet screen 140 and the actuating magnet screen 142 viewed from one side, together with the rod magnet in the first position 141a and the actuating magnet in the first position 143b. FIG. 14b also shows part of a sheet of non-magnetic material 145 located between the rod magnet screen 140 and actuating magnet screen 142. The sheet of non-magnetic material 145 is omitted from FIG. 14a for ease of illustration.

The sheet of non-magnetic material 145 forms part of an enclosure (not shown) which seals the actuating magnet 143, motor (not shown) and other parts of the actuator in an environment which is isolated from the rod magnet 141, rod magnet screen 140 and mirror (not shown).

The rod magnet screen 140 comprises a ring of a magnetic material (for example a ferromagnetic material such as steel, e.g. low carbon steel). The actuating magnet screen 142 comprises an opening 150 formed in a sheet of magnetic material (for example a ferromagnetic material such as steel, e.g. low carbon steel). The actuating magnet screen 142 may correspond with the plate 122 of FIG. 12, albeit with a different shaped opening 150.

The opening 150 is curved in a concave manner at surfaces 151a,b which are at opposite ends of travel of the actuating magnet 143. The concave surfaces 151a,b are connected by two convex surfaces 152a,b. A recess 153a,b is formed in each convex surface 152a,b. Each recess 153a,b has the form of a partial circle.

The opening 150 of the actuating magnet screen 142 may be longer in the direction of travel of the actuating magnet than the rod magnet screen 140, for example as is shown in FIG. 14. The rod magnet screen 140 may act as an end stop, thereby limiting travel of the rod magnet 141. The opening 150 of the actuating magnet screen 142 may also act as an end stop, thereby limiting travel of the actuating magnet 143. Since the opening 150 is longer in the direction of travel than the actuating magnet screen 142, the actuating magnet 143 may travel further than the rod magnet 141.

As can be seen in FIG. 14a, an innermost surface of the rod magnet screen 140 acts as an end stop when the rod magnet 141 is in the first position 141a. The concave portion 151a of the opening 150 of the actuating magnet screen 142 allows the actuating magnet 143 to travel further than the rod magnet 141 to an associated first position 143a. Similarly, an innermost surface of the rod magnet screen 140 acts as an end stop when the rod magnet 141 is in the second position 141b. The concave portion 151b of the opening 150 of the actuating magnet screen 142 allows the actuating magnet 143 to travel further than the rod magnet 141 to an associated second position 143b.

The rod magnet screen 140 and the actuating magnet screen 142 are adjacent to one another, albeit separated by the sheet of non-magnetic material 145. As a result of these adjacent locations, the rod magnet screen 140 has a significant effect upon the magnetic field of both the rod magnet 141 and the actuating magnet 143. Similarly, the actuating magnet screen 142 has a significant effect upon the magnetic field of both the actuating magnet 143 and the rod magnet 141. It may be said that the rod magnet screen 140 and the actuating magnet screen 142 together provide a combined screening effect.

The combined screening effect provided by the actuating magnet screen 142 and the rod magnet screen 140 reduces the force which is required in order to hold the actuating magnet 143 in the first position 143a (or the second position 143b).

The magnetization of the actuating magnet 143 and the rod magnet 141 is such that they are pulled towards each other. Thus, in embodiments of the invention the actuating magnet 143 and the rod magnet 141 are resiliently biased to align with one another. When the actuating magnet 143 is in the first position 143a it is no longer aligned with the rod magnet 141, and hence the rod magnet exerts force which pulls the actuating magnet towards the rod magnet. The combined screening effect provided by the actuating magnet screen 142 and the rod magnet screen 140 reduces this force, since it partially screens the magnetic field of the rod magnet 141 from the magnetic field of the actuating magnet 143.

Since the force required in order to hold the actuating magnet 143 in the first position 143a or the second position 143b is reduced, the actuating magnet may be actuated using a motor which has a lower force output than would otherwise be the case.

The rod magnet screen 140 and actuating magnet screen 142 may reduce the force which is required to move the rod magnet 141 from the first position to the second position (and vice versa). The rod magnet screen 140 and the actuating magnet screen 142 may compensate or substantially compensate for resilient biasing of the rod 111 (see FIG. 11).

A motor which generates a lower output force may be cheaper to manufacture and to operate than a motor which generates a higher output force, and thus may reduce the cost of making and operating the actuator. Furthermore, the motor uses a less current, and thus may be driven using cheaper driving electronics.

The rod magnet screen 140 and the actuating magnet screen 142 may screen the rod magnet 141 and the actuating magnet 143 from magnets of adjacent actuators.

The term 'magnet screen' may be interpreted as meaning a magnetic material which reduces the strength of an unwanted magnetic field, compared with the strength of the unwanted magnetic field that would be present in the absence of the magnet screen.

The sheet of non-magnetic material 145 may for example be 0.5 mm thick (or may have some other thickness). Providing the sheet of non-magnetic material with a narrow thickness allows the rod magnet 141 and the actuating magnet 143 to be close to each other, thereby allowing strong coupling between them to be established. The rod magnet screen 140 may be in contact with the sheet of non-magnetic material 145. The actuating magnet screen 142 may also be in contact with the sheet of non-magnetic material 145. The non-magnetic material 145 does not have a significant effect upon the magnetic field of the rod magnet screen 140 or the actuating magnet screen 142. In other arrangements, other materials may be interposed between the rod magnet screen 140 and the sheet of non-magnetic material 145 and/or between the actuating magnet screen 142 and the sheet of non-magnetic material 145.

A clearance of for example 0.5 mm may be provided between the rod magnet 141 and the sheet of non-magnetic material 145. Similarly, a clearance of for example 0.5 mm may be provided between the actuating magnet 143 and the sheet of non-magnetic material 145.

The rod magnet screen 140 and the actuating magnet screen 142 provide structural support to the sheet of non-magnetic material 145. This helps the sheet of non-magnetic material 145 to withstand forces arising from a vacuum being established on one side of the sheet and not on the other side of the sheet.

The opening 150 in the actuating magnet screen may have a shape which differs from the shape shown in FIG. 14. Similarly, the rod magnet screen 140 may have a shape which differs from the shape shown in FIG. 14. Irrespective of the shapes, the rod magnet screen 140 and the actuating magnet screen 142 provide a combined screening effect. The combined screening effect reduces the force which is required to hold the actuating magnet 143 in the first position 143a or the second position 143b.

Although it is appreciated that the use of a motor which generates a relatively low output force or output torque may be advantageous, the motor 116 which drives the rotatable mount 115 with the actuator magnet 114 may instead according to an aspect of the invention be a motor arranged to provide a relatively high output torque. An advantage is that then the resilient biasing of the rod 111 to a position between the first and second positions (e.g. the central position in FIG.

9) can be constructed to provide improved thermal conduction. Such a construction typically features a corresponding higher stiffness. An improved thermal conductance mitigates the problem of heating of primary reflective elements due to absorption of EUV radiation. For example, to overcome the respective higher stiffness of the actuator 109, the motor 116 may include a gear system with a reduction factor of more than 10. For lower reduction factors, the gearing may no longer be sufficiently stiff to keep the rod 111 in the first position (or second position) when the motor is switched off. Further, for gear reduction factors in the range of 10 and higher, the current needed to drive the motor may be reduced by a factor ten or more over a current needed to drive a motor which does not include a gear box.

Figure 15:
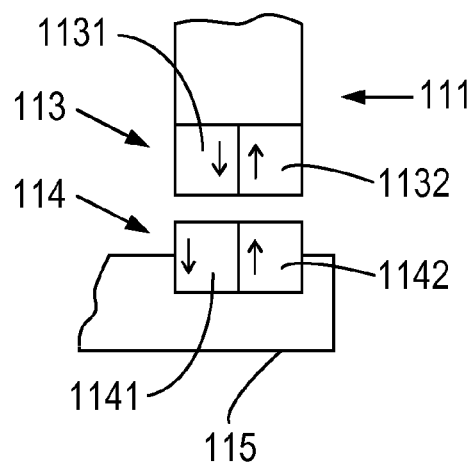
FIG. 15 illustrates magnets comprising pairs of oppositely magnetized magnets of an actuator according to an embodiment of the invention.
Figure 16:
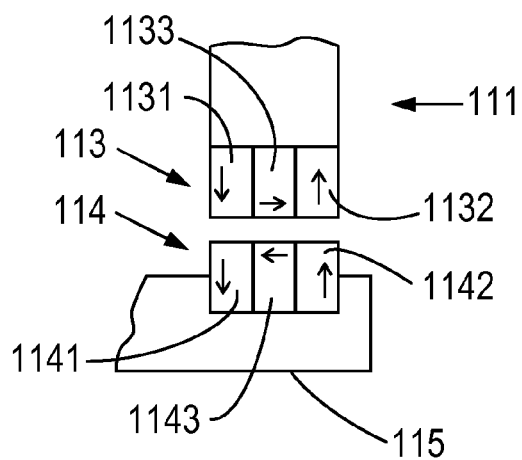
FIG. 16 shows the magnets comprising pairs of oppositely magnetized magnets separated by a third magnet.
Figure 17:
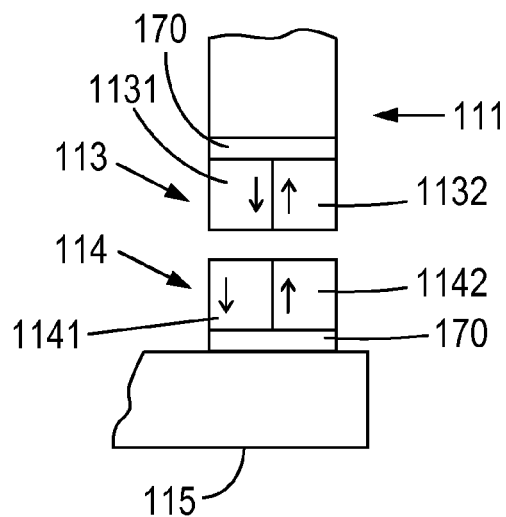
FIG. 17 illustrates magnets comprising pairs of oppositely magnetized magnets including yokes.

According to an aspect of the invention, an actuator 109 of relatively high stiffness includes rod and actuator magnets 113 and 114 as illustrated in FIG. 15. The rod magnet 113 comprises a pair of magnets 1131 and 1132, magnetized in parallel and opposite directions, the directions being substantially perpendicular to the direction of movement (the x-direction in FIGS. 9, 11 and 15), for example perpendicular to the x,y plane in FIG. 15. The directions of magnetization are indicated by arrows in FIG. 15. The actuator magnet 114 comprises a pair of magnets 1141 and 1142 magnetized in the same direction as the respective magnets 1131 and 1132. The magnets 1131 and 1132 may be arranged directly adjacent to each other or may alternatively enclose a third magnet 1133 magnetized along the direction of movement (the x-direction in FIGS. 9 and 11), as illustrated in FIG. 16. Similarly the magnets 1141 and 1142 may be arranged directly adjacent to each other or may alternatively enclose a third magnet 1143 magnetized opposite to the aforementioned direction of magnetization the magnet 1133. In the presence of the third magnets 1133 and 1143 a further increase of actuator stiffness is obtained.

It is appreciated that a spatial extent in the x,y plane in FIGS. 9 and 11 of the magnetic field lines is reduced compared to a spatial extent of the magnetic field lines when the rod magnet 113 and the actuator magnet 114 each consist of a single magnet. As a consequence, the problem of magnetic cross talk between adjacent actuators is further mitigated. Further, a lateral force between the rod and actuator magnets arising when the drive magnet is moved with respect to the flex magnet is increased compared to the lateral force that would arise when the rod and actuator magnets each consist of a single magnet. The present embodiment of the actuator 109 results in a magnetic coupling with an at least 1.3 times larger force capability (or stiffness) in the direction of movement of the rod magnet, whilst maintaining a same total magnet volume when compared to the embodiments where the rod and actuator magnets each consist of a single magnet. Further, in combination with the magnetic screens, such as for example the screen 122 shown in FIG. 12, or the screens 140 and 142 shown in FIG. 14b, a relatively low negative stiffness of the actuator results for a range of actuator positions centered at the aforementioned central position to which it is resiliently biased. An actuator with single-magnet rod and actuator magnets features a higher negative stiffness in that range of positions. The said relatively low negative stiffness reduces a risk of the gear assembly of the motor 116 to run through its backlash (with a corresponding orientation error of the mirror 110 in its central position).

As shown at the hand of examples further below, the invention is not limited to the embodiment where both the rod magnet and the actuator magnet include pairs of oppositely magnetized magnets. In alternative embodiments just one of the two magnets, either the rod magnet 113, or the actuator magnet 114 may comprise a pair of oppositely magnetized magnets.

One or each of the rod and actuator magnets may further include a yoke 170, disposed at the surface of the rod and/or actuator magnet opposite to the surface facing the space between the rod and actuator magnets. The presence of yokes 170 leads to a further reduction of magnetic cross talk between neighboring actuators. The yoke may for example be an iron yoke. An alternative embodiment is the same as this embodiment, save for the fact that now the actuator magnet as a whole is replaced by a single yoke. In a further alternative embodiment the rod and actuator magnets consist of the magnets 1133 and 1143 and yokes replacing the magnets 1131, 1132, 1141, and 1142. In any of these embodiments the presence of the yokes leads to a further reduction of magnetic cross talk between neighboring actuators. The yokes may for example be iron yokes. The actuators described above wherein a yoke replaces a magnet are easier to manufacture but have less stiffness than the embodiment where none of the magnets is replaced by a yoke.

The embodiments describing the rod and or actuator magnets as including pairs of magnets oppositely magnetized can also be arranged in cylindrical symmetry respect to an axis perpendicular to the direction of movement of the rod and actuator magnets. For example, the magnet 1131 can be a cylinder shaped magnet enclosing a cylinder shaped magnet 1132, where the opposite magnetizations are arranged parallel to the cylinder axis. In such an arrangement, the magnet 1133 can be placed between the inner and outer cylinder shaped magnets, and have a radial magnetization. An actuator having any such cylinder shaped rod and actuator magnets has a substantially rotationally uniform stiffness with respect to an axis perpendicular to the directions of movement of the magnets, which may be desirable.

The term 'motor' is not intended to be limited to the examples of motors mentioned above, but is instead intended to encompass any device which converts electricity into motion, or some other form of energy into motion (e.g. a hydraulic motor which converts hydraulic pressure into motion).

In the described embodiments, the mirror 110 is connected to a rotatably mounted rod 111 which is provided with a magnet 113. Moving the magnet 113 causes the rod 111 to move, which in turn causes the mirror to rotate. In an alternative embodiment, the magnet may be attached to the lower surface of the mirror, which may be pivotally mounted. Movement of the actuating magnet towards or away from the mirror mounted magnet will cause the mirror to rotate. In further embodiments, the magnet may cause the mirror to move in some other way. In general, there may be a connection between the magnet and the mirror.

Cartesian coordinates are shown on some of the Figures. This is to facilitate description of the Figures, and is not intended to mean that any parts of the invention must have a particular orientation.

The above described embodiments have referred to a mirror 110. The mirror 110 is merely an example of a reflective element. Any suitable reflective element may be used.

The above description of embodiments has referred to a reflective illumination system (e.g. comprising part of an EUV lithographic apparatus). However, an embodiment of the invention may be provided in an illumination system which comprises refractive elements. An embodiment of the invention may for example be provided in a DUV lithographic apparatus. One or more refractive optical components may be provided in the illumination system pupil plane instead of or in addition to reflective optical components.

Although the described embodiment of the invention refers to an illumination system of a lithographic apparatus, an embodiment of the invention may be provided at any suitable location in a lithographic apparatus.

Although the array of reflective elements is described in the context of a lithographic apparatus, it may be provided in other apparatus.

While specific embodiments of the invention have been described above, it will be appreciated that the invention may be practiced otherwise than as described. The description is not intended to limit the invention.

The features described herein are applicable to all aspects of the invention and may be used in any combination.

The invention claimed is:

1. An optical apparatus comprising a moveable reflective element and associated actuator, the actuator comprising a first magnet connected to the moveable reflective element such that movement of the first magnet will cause the moveable reflective element to move, and a second magnet connected to a motor such that operation of the motor will cause the second magnet to move, wherein the second magnet is positioned relative to the first magnet such that there is magnetic interaction between the second magnet and the first magnet and movement of the second magnet will cause the first magnet to move, wherein the motor and the second magnet are sealed relative to the moveable reflective element and the first magnet.

2. The optical apparatus of claim 1, wherein the first magnet is connected to the moveable reflective element by a rotatably mounted rod.

3. The optical apparatus of claim 1, further comprising a first end stop arranged to limit movement of the first magnet and determine a first position of the first magnet, and a second end stop arranged to limit movement of the first magnet and determine a second position of the first magnet.

4. The optical apparatus of claim 1, wherein the motor is a rotary motor, and the second magnet is displaced from the axis of rotation of the rotary motor.

5. The optical apparatus of claim 1, wherein the moveable reflective element and associated actuator are part of an array of moveable reflective elements and associated actuators.

6. The optical apparatus of claim 5, wherein the motors and second magnets of the array are located in an enclosure which is sealed relative to the moveable reflective elements and the first magnets of the array.

7. The optical apparatus of claim 6, wherein a demultiplexer is located in the enclosure, the demultiplexer configured to demultiplex a multiplexed incoming signal and provide a signal to each of a plurality of motors.

8. The optical apparatus of claim 5, further comprising a plate having a plurality of openings, each opening providing a first end stop arranged to limit movement of an associated first magnet and determine a first position of the associated first magnet, and providing a second end stop arranged to limit movement of the associated first magnet and determine a second position of the associated first magnet.

9. The optical apparatus of claim 8, wherein the plate is formed from ferromagnetic material.

10. The optical apparatus of claim 8, wherein the first end stop is arranged to limit movement of the associated first magnet in a first direction, and the second end stop is arranged to limit movement of the associated first magnet in the first direction.

11. The optical apparatus of claim 8, wherein the first end stop is arranged to limit movement of the associated first magnet in a first direction and a second direction which is transverse to the first direction, and the second end stop is arranged to limit movement of the associated first magnet in the first direction and a second direction which is transverse to the first direction.

12. The optical apparatus of claim 1, wherein the first magnet is provided with a bearing.

13. The optical apparatus of claim 1, wherein the apparatus further comprises a magnetic screen which comprises a first screen associated with the first magnet, and a second screen associated with the second magnet, the first screen and the second screen being adjacent to one another.

14. The optical apparatus of claim 13, wherein the combined screening effect acts to reduce the force required to hold the second magnet in the first position or the second position, compared with the force which would be required if the first and second screens were not present.

15. The optical apparatus of claim 13, wherein the second screen comprises a plate formed from magnetic material, the plate being provided with an opening within which the second magnet is located.

16. The optical apparatus of claim 13, wherein the first screen comprises a ring of magnetic material within which the first magnet is located.

17. The optical apparatus of claim 13, wherein at least one of the first screen or the second screen is in contact with a sheet of non-magnetic material which lies between the first magnet and the second magnet.

18. The optical apparatus of claim 1, wherein the first magnet or the second magnet comprises a pair of magnets, the members of the pair of magnets being magnetized in parallel and opposite directions.

19. A lithographic apparatus comprising:
an optical apparatus comprising a moveable reflective element and associated actuator, the actuator comprising a first magnet connected to the moveable reflective element such that movement of the first magnet will cause the moveable reflective element to move, and a second magnet connected to a motor such that operation of the motor will cause the second magnet to move, wherein the second magnet is positioned relative to the first magnet such that there is magnetic interaction between the second magnet and the first magnet and movement of the second magnet will cause the first magnet to move, wherein the motor and the second magnet are sealed relative to the moveable reflective element and the first magnet.

20. A method of changing the orientation of a moveable reflective element, the method comprising using a motor to move a second magnet, using movement of the second magnet to move a first magnet via magnetic interaction between the first magnet and the second magnet, and using movement of the first magnet to change the orientation of the moveable reflective element via a connection between the first magnet and the moveable reflective element, wherein the motor and the second magnet are sealed relative to the moveable reflective element and the first magnet.

21. The method of claim 20, wherein the first magnet is connected to the moveable reflective element by a rotatably mounted rod.

22. The method of claim 20, wherein movement of the first magnet is limited by a first end stop to determine a first position of the first magnet, and by a second end stop to determine a second position of the first magnet.

* * * * *